United States Patent
Ahn et al.

(10) Patent No.: US 7,388,246 B2
(45) Date of Patent: Jun. 17, 2008

(54) LANTHANIDE DOPED $TIO_X$ DIELECTRIC FILMS

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/427,569

(22) Filed: Jun. 29, 2006

(65) Prior Publication Data

US 2006/0237764 A1    Oct. 26, 2006

Related U.S. Application Data

(62) Division of application No. 10/233,309, filed on Aug. 29, 2002, now Pat. No. 7,084,078.

(51) Int. Cl.
*H01L 27/108* (2006.01)
(52) U.S. Cl. .................. 257/310; 257/324; 257/410
(58) Field of Classification Search ................ 257/310, 257/410, 411, 324
See application file for complete search history.

(56) References Cited

U.S. PATENT DOCUMENTS

| 2,501,563 | A | 3/1950 | Colbert et al. |
|---|---|---|---|
| 4,058,430 | A | 11/1977 | Suntola et al. |
| 4,333,808 | A | 6/1982 | Bhattacharyya et al. |
| 4,413,022 | A | 11/1983 | Suntola et al. |
| 5,049,516 | A | 9/1991 | Arima |
| 5,055,319 | A | 10/1991 | Bunshah et al. |
| 5,426,603 | A | 6/1995 | Nakamura et al. |
| 5,439,524 | A | 8/1995 | Cain et al. |
| 5,572,052 | A | 11/1996 | Kashihara et al. |
| 5,674,563 | A | 10/1997 | Tarui et al. |
| 5,698,022 | A | 12/1997 | Glassman et al. |
| 5,714,336 | A | 2/1998 | Simons et al. |
| 5,714,766 | A | 2/1998 | Chen et al. |
| 5,739,524 | A | 4/1998 | Fally |
| 5,795,808 | A | 8/1998 | Park |

(Continued)

FOREIGN PATENT DOCUMENTS

EP    0540993 A1    5/1993

(Continued)

OTHER PUBLICATIONS

Aarik, Jaan, "Atomic layer growth of epitaxial $TiO_2$ thin films from $TiCl_4$ and $H_2O$ on alpha $Al_2O_3$ substrates", *Journal of Crystal Growth*, 242(1-2), (2002), 189-198.

(Continued)

*Primary Examiner*—Tuan H Nguyen
(74) *Attorney, Agent, or Firm*—Schwegman, Lundberg & Woessner, P.A.

(57) ABSTRACT

A dielectric film containing lanthanide doped $TiO_x$ and a method of fabricating such a dielectric film produce a reliable dielectric layer having an equivalent oxide thickness thinner than attainable using $SiO_2$. The lanthanide doped $TiO_x$ dielectric layer is arranged as a layered structure of one or more monolayers of the lanthanide doped $TiO_x$. The dopant may be selected from a group consisting of Nd, Tb, and Dy.

40 Claims, 10 Drawing Sheets

U.S. PATENT DOCUMENTS

| | | | |
|---|---|---|---|
| 5,801,105 A | 9/1998 | Yano et al. |
| 5,810,923 A | 9/1998 | Yano et al. |
| 5,828,080 A | 10/1998 | Yano et al. |
| 5,840,897 A | 11/1998 | Kirlin et al. |
| 5,879,459 A | 3/1999 | Gadgil et al. |
| 5,912,797 A | 6/1999 | Schneemeyer et al. |
| 5,916,365 A | 6/1999 | Sherman |
| 5,923,056 A | 7/1999 | Lee et al. |
| 5,958,140 A | 9/1999 | Arami et al. |
| 6,020,024 A | 2/2000 | Maiti et al. |
| 6,025,627 A | 2/2000 | Forbes et al. |
| 6,034,015 A | 3/2000 | Lin et al. |
| 6,060,755 A | 5/2000 | Ma et al. |
| 6,063,705 A | 5/2000 | Vaartstra |
| 6,093,944 A | 7/2000 | VanDover |
| 6,110,529 A | 8/2000 | Gardiner et al. |
| 6,162,712 A | 12/2000 | Baum et al. |
| 6,174,809 B1 | 1/2001 | Kang et al. |
| 6,194,237 B1 | 2/2001 | Kim et al. |
| 6,200,893 B1 | 3/2001 | Sneh |
| 6,203,613 B1 | 3/2001 | Gates et al. |
| 6,207,589 B1 | 3/2001 | Ma et al. |
| 6,211,035 B1 | 4/2001 | Moise et al. |
| 6,225,168 B1 | 5/2001 | Gardner et al. |
| 6,274,937 B1 | 8/2001 | Ahn et al. |
| 6,281,042 B1 | 8/2001 | Ahn et al. |
| 6,289,842 B1 | 9/2001 | Tompa |
| 6,291,341 B1 | 9/2001 | Sharan et al. |
| 6,294,813 B1 | 9/2001 | Forbes et al. |
| 6,297,103 B1 | 10/2001 | Ahn et al. |
| 6,297,539 B1 | 10/2001 | Ma et al. |
| 6,331,465 B1 | 12/2001 | Forbes et al. |
| 6,346,477 B1 | 2/2002 | Kaloyeros et al. |
| 6,350,704 B1 | 2/2002 | Ahn et al. |
| 6,387,712 B1 | 5/2002 | Yano et al. |
| 6,391,769 B1 | 5/2002 | Lee et al. |
| 6,420,230 B1 | 7/2002 | Derderian et al. |
| 6,432,779 B1 | 8/2002 | Hobbs et al. |
| 6,441,417 B1 | 8/2002 | Zhang et al. |
| 6,444,592 B1 | 9/2002 | Ballantine et al. |
| 6,448,192 B1 | 9/2002 | Kaushik |
| 6,451,641 B1 | 9/2002 | Halliyal et al. |
| 6,451,695 B2 | 9/2002 | Sneh |
| 6,454,912 B1 | 9/2002 | Ahn et al. |
| 6,458,701 B1 | 10/2002 | Chae et al. |
| 6,461,436 B1 | 10/2002 | Campbell et al. |
| 6,465,334 B1 | 10/2002 | Buynoski et al. |
| 6,465,853 B1 | 10/2002 | Hobbs et al. |
| 6,495,436 B2 | 12/2002 | Ahn et al. |
| 6,509,280 B2 | 1/2003 | Choi |
| 6,514,820 B2 | 2/2003 | Ahn et al. |
| 6,521,911 B2 | 2/2003 | Parsons et al. |
| 6,527,866 B1 | 3/2003 | Matijasevic et al. |
| 6,531,354 B2 | 3/2003 | Maria et al. |
| 6,534,357 B1 | 3/2003 | Basceri |
| 6,534,420 B2 | 3/2003 | Ahn et al. |
| 6,537,613 B1 | 3/2003 | Senzaki et al. |
| 6,538,330 B1 | 3/2003 | Forbes |
| 6,541,079 B1 | 4/2003 | Bojarczuk, Jr. et al. |
| 6,541,280 B2 | 4/2003 | Kaushik et al. |
| 6,541,353 B1 | 4/2003 | Sandhu et al. |
| 6,544,846 B2 | 4/2003 | Ahn et al. |
| 6,551,893 B1 | 4/2003 | Zheng et al. |
| 6,551,929 B1 | 4/2003 | Kori et al. |
| 6,552,383 B2 | 4/2003 | Ahn et al. |
| 6,559,472 B2 | 5/2003 | Sandhu et al. |
| 6,570,248 B1 | 5/2003 | Ahn et al. |
| 6,586,349 B1 | 7/2003 | Jeon et al. |
| 6,586,792 B2 | 7/2003 | Ahn et al. |
| 6,592,942 B1 | 7/2003 | Van Wijck |
| 6,596,636 B2 | 7/2003 | Sandhu et al. |
| 6,602,338 B2 | 8/2003 | Chen et al. |
| 6,608,378 B2 | 8/2003 | Ahn et al. |
| 6,613,656 B2 | 9/2003 | Li |
| 6,613,695 B2 | 9/2003 | Pomarede et al. |
| 6,617,639 B1 | 9/2003 | Wang et al. |
| 6,620,670 B2 | 9/2003 | Song et al. |
| 6,627,260 B2 | 9/2003 | Derderian et al. |
| 6,627,503 B2 | 9/2003 | Ma et al. |
| 6,632,279 B1 | 10/2003 | Ritala et al. |
| 6,638,859 B2 | 10/2003 | Sneh et al. |
| 6,642,567 B1 | 11/2003 | Marsh |
| 6,645,882 B1 | 11/2003 | Halliyal et al. |
| 6,652,924 B2 | 11/2003 | Sherman |
| 6,660,660 B2 | 12/2003 | Haukka et al. |
| 6,661,058 B2 | 12/2003 | Ahn et al. |
| 6,673,701 B1 | 1/2004 | Marsh et al. |
| 6,674,138 B1 | 1/2004 | Halliyal et al. |
| 6,696,332 B2 | 2/2004 | Visokay et al. |
| 6,699,747 B2 | 3/2004 | Ruff et al. |
| 6,709,989 B2 | 3/2004 | Ramdani et al. |
| 6,710,538 B1 | 3/2004 | Ahn et al. |
| 6,713,329 B1 | 3/2004 | Wagner et al. |
| 6,713,846 B1 | 3/2004 | Senzaki |
| 6,720,221 B1 | 4/2004 | Ahn et al. |
| 6,730,575 B2 | 5/2004 | Eldridge |
| 6,750,066 B1 | 6/2004 | Cheung et al. |
| 6,754,108 B2 | 6/2004 | Forbes |
| 6,756,298 B2 | 6/2004 | Ahn et al. |
| 6,759,081 B2 | 7/2004 | Huganen et al. |
| 6,767,582 B1 | 7/2004 | Elers |
| 6,767,795 B2 | 7/2004 | Ahn et al. |
| 6,770,923 B2 | 8/2004 | Nguyen et al. |
| 6,774,050 B2 | 8/2004 | Ahn et al. |
| 6,777,353 B2 | 8/2004 | Putkonen |
| 6,778,441 B2 | 8/2004 | Forbes et al. |
| 6,780,704 B1 | 8/2004 | Raaijmakers et al. |
| 6,784,101 B1 | 8/2004 | Yu et al. |
| 6,787,370 B2 | 9/2004 | Forbes |
| 6,787,413 B2 | 9/2004 | Ahn |
| 6,790,791 B2 | 9/2004 | Ahn et al. |
| 6,794,709 B2 | 9/2004 | Ahn et al. |
| 6,800,567 B2 | 10/2004 | Cho |
| 6,803,326 B2 | 10/2004 | Ahn et al. |
| 6,804,136 B2 | 10/2004 | Forbes |
| 6,812,100 B2 | 11/2004 | Ahn et al. |
| 6,812,157 B1 | 11/2004 | Gadgil |
| 6,821,862 B2 | 11/2004 | Cho |
| 6,821,873 B2 | 11/2004 | Visokay et al. |
| 6,828,632 B2 | 12/2004 | Bhattacharyya |
| 6,831,315 B2 | 12/2004 | Raaijmakers et al. |
| 6,833,285 B1 | 12/2004 | Ahn et al. |
| 6,833,308 B2 | 12/2004 | Ahn et al. |
| 6,835,111 B2 | 12/2004 | Ahn et al. |
| 6,844,203 B2 | 1/2005 | Ahn et al. |
| 6,852,167 B2 | 2/2005 | Ahn |
| 6,858,120 B2 | 2/2005 | Ahn et al. |
| 6,858,444 B2 | 2/2005 | Ahn et al. |
| 6,858,865 B2 | 2/2005 | Ahn et al. |
| 6,884,719 B2 | 4/2005 | Chang et al. |
| 6,884,739 B2 | 4/2005 | Ahn et al. |
| 6,888,739 B2 | 5/2005 | Forbes |
| 6,893,984 B2 | 5/2005 | Ahn et al. |
| 6,900,122 B2 | 5/2005 | Ahn et al. |
| 6,914,800 B2 | 7/2005 | Ahn et al. |
| 6,919,266 B2 | 7/2005 | Ahn et al. |
| 6,921,702 B2 | 7/2005 | Ahn et al. |
| 6,930,346 B2 | 8/2005 | Ahn et al. |
| 6,953,730 B2 | 10/2005 | Ahn et al. |
| 6,958,302 B2 | 10/2005 | Ahn et al. |
| 6,960,538 B2 | 11/2005 | Ahn et al. |
| 6,989,573 B2 | 1/2006 | Ahn et al. |
| 7,037,574 B2 | 5/2006 | Paranjpe et al. |
| 7,068,544 B2 | 6/2006 | Forbes et al. |

| | | | | | | |
|---|---|---|---|---|---|---|
| 7,081,421 B2 | 7/2006 | Ahn et al. | | 2003/0045082 A1 | 3/2003 | Eldridge et al. |
| 7,084,078 B2 | 8/2006 | Ahn et al. | | 2003/0048666 A1 | 3/2003 | Eldridge et al. |
| 7,101,813 B2 | 9/2006 | Ahn et al. | | 2003/0049942 A1 | 3/2003 | Haukka et al. |
| 7,129,553 B2 | 10/2006 | Ahn et al. | | 2003/0052358 A1 | 3/2003 | Weimer |
| 7,138,336 B2 | 11/2006 | Lee et al. | | 2003/0059535 A1 | 3/2003 | Luo et al. |
| 7,160,577 B2 | 1/2007 | Ahn et al. | | 2003/0104666 A1 | 6/2003 | Bojarczuk, Jr. et al. |
| 7,160,817 B2 * | 1/2007 | Marsh ...................... 438/763 | | 2003/0119246 A1 | 6/2003 | Ahn |
| 7,169,673 B2 | 1/2007 | Ahn et al. | | 2003/0119291 A1 | 6/2003 | Ahn et al. |
| 7,183,186 B2 | 2/2007 | Ahn et al. | | 2003/0119313 A1 | 6/2003 | Yang et al. |
| 7,192,824 B2 | 3/2007 | Ahn et al. | | 2003/0132491 A1 | 7/2003 | Ahn |
| 7,192,892 B2 | 3/2007 | Ahn et al. | | 2003/0139039 A1 | 7/2003 | Ahn et al. |
| 7,195,999 B2 | 3/2007 | Forbes et al. | | 2003/0143801 A1 | 7/2003 | Basceri et al. |
| 7,199,023 B2 | 4/2007 | Ahn et al. | | 2003/0157764 A1 | 8/2003 | Ahn et al. |
| 7,205,218 B2 | 4/2007 | Ahn et al. | | 2003/0170389 A1 | 9/2003 | Sandhu |
| 7,205,620 B2 | 4/2007 | Ahn et al. | | 2003/0170403 A1 | 9/2003 | Doan et al. |
| 7,208,804 B2 | 4/2007 | Ahn et al. | | 2003/0181039 A1 | 9/2003 | Sandhu et al. |
| 7,211,492 B2 | 5/2007 | Forbes et al. | | 2003/0183156 A1 | 10/2003 | Dando et al. |
| 7,214,994 B2 | 5/2007 | Forbes et al. | | 2003/0193061 A1 | 10/2003 | Osten |
| 7,235,501 B2 | 6/2007 | Ahn et al. | | 2003/0194861 A1 | 10/2003 | Mardian et al. |
| 7,235,854 B2 | 6/2007 | Ahn et al. | | 2003/0194862 A1 | 10/2003 | Mardian |
| 7,259,434 B2 | 8/2007 | Ahn et al. | | 2003/0203626 A1 | 10/2003 | Derderian et al. |
| 2001/0002280 A1 | 5/2001 | Sneh | | 2003/0207032 A1 | 11/2003 | Ahn et al. |
| 2001/0005625 A1 | 6/2001 | Sun et al. | | 2003/0207540 A1 | 11/2003 | Ahn et al. |
| 2001/0009695 A1 | 7/2001 | Saanita et al. | | 2003/0207593 A1 | 11/2003 | Derderian et al. |
| 2001/0012698 A1 | 8/2001 | Hayashi et al. | | 2003/0222300 A1 | 12/2003 | Basceri et al. |
| 2001/0014526 A1 | 8/2001 | Clevenger et al. | | 2003/0224600 A1 | 12/2003 | Cao et al. |
| 2001/0019876 A1 | 9/2001 | Juengling et al. | | 2003/0227033 A1 | 12/2003 | Ahn et al. |
| 2001/0030352 A1 | 10/2001 | Ruf et al. | | 2003/0228747 A1 | 12/2003 | Ahn et al. |
| 2001/0034117 A1 | 10/2001 | Eldridge et al. | | 2003/0232511 A1 | 12/2003 | Metzner et al. |
| 2001/0042505 A1 | 11/2001 | Vaartstra | | 2003/0235961 A1 | 12/2003 | Metzner et al. |
| 2001/0050438 A1 | 12/2001 | Juengling et al. | | 2004/0004244 A1 | 1/2004 | Ahn et al. |
| 2002/0001971 A1 | 1/2002 | Cho | | 2004/0004245 A1 | 1/2004 | Forbes et al. |
| 2002/0004276 A1 | 1/2002 | Ahn et al. | | 2004/0004247 A1 | 1/2004 | Forbes et al. |
| 2002/0004277 A1 | 1/2002 | Ahn et al. | | 2004/0004859 A1 | 1/2004 | Forbes et al. |
| 2002/0013052 A1 | 1/2002 | Visokay | | 2004/0007171 A1 | 1/2004 | Ritala et al. |
| 2002/0019125 A1 | 2/2002 | Juengling et al. | | 2004/0009679 A1 | 1/2004 | Yeo et al. |
| 2002/0024080 A1 | 2/2002 | Derderian et al. | | 2004/0016944 A1 | 1/2004 | Ahn et al. |
| 2002/0025628 A1 | 2/2002 | Derderian et al. | | 2004/0023461 A1 | 2/2004 | Ahn et al. |
| 2002/0037603 A1 | 3/2002 | Eldridge et al. | | 2004/0033681 A1 | 2/2004 | Ahn et al. |
| 2002/0046705 A1 | 4/2002 | Sandhu et al. | | 2004/0033701 A1 | 2/2004 | Ahn et al. |
| 2002/0053869 A1 | 5/2002 | Ahn et al. | | 2004/0038525 A1 | 2/2004 | Meng et al. |
| 2002/0068466 A1 | 6/2002 | Lee et al. | | 2004/0038554 A1 | 2/2004 | Ahn |
| 2002/0086507 A1 | 7/2002 | Park et al. | | 2004/0043541 A1 | 3/2004 | Ahn et al. |
| 2002/0100418 A1 | 8/2002 | Sandhu et al. | | 2004/0043569 A1 | 3/2004 | Ahn et al. |
| 2002/0102818 A1 | 8/2002 | Sandhu et al. | | 2004/0043635 A1 | 3/2004 | Vaartstra |
| 2002/0110991 A1 | 8/2002 | Li | | 2004/0065255 A1 | 4/2004 | Yang et al. |
| 2002/0117704 A1 | 8/2002 | Gonzalez | | 2004/0110348 A1 | 6/2004 | Ahn et al. |
| 2002/0122885 A1 | 9/2002 | Ahn | | 2004/0110391 A1 | 6/2004 | Ahn et al. |
| 2002/0135048 A1 | 9/2002 | Ahn | | 2004/0144980 A1 | 7/2004 | Ahn et al. |
| 2002/0142536 A1 | 10/2002 | Zhang et al. | | 2004/0156578 A1 | 8/2004 | Geusic et al. |
| 2002/0146916 A1 | 10/2002 | Irino et al. | | 2004/0159863 A1 | 8/2004 | Eldridge et al. |
| 2002/0155688 A1 | 10/2002 | Ahn | | 2004/0161899 A1 | 8/2004 | Luo et al. |
| 2002/0155689 A1 | 10/2002 | Ahn | | 2004/0164357 A1 | 8/2004 | Ahn et al. |
| 2002/0164420 A1 | 11/2002 | Derderian et al. | | 2004/0164365 A1 | 8/2004 | Ahn et al. |
| 2002/0167057 A1 | 11/2002 | Ahn et al. | | 2004/0169453 A1 | 9/2004 | Ahn et al. |
| 2002/0170671 A1 | 11/2002 | Matsuhita et al. | | 2004/0175882 A1 | 9/2004 | Ahn et al. |
| 2002/0177244 A1 | 11/2002 | Hsu et al. | | 2004/0178439 A1 | 9/2004 | Ahn et al. |
| 2002/0192974 A1 | 12/2002 | Ahn et al. | | 2004/0183108 A1 | 9/2004 | Ahn |
| 2002/0192975 A1 | 12/2002 | Ahn | | 2004/0185654 A1 | 9/2004 | Ahn |
| 2002/0192979 A1 | 12/2002 | Ahn | | 2004/0189175 A1 | 9/2004 | Ahn et al. |
| 2002/0195056 A1 | 12/2002 | Sandhu et al. | | 2004/0214399 A1 | 10/2004 | Ahn et al. |
| 2002/0197793 A1 | 12/2002 | Dornfest et al. | | 2004/0219783 A1 | 11/2004 | Ahn et al. |
| 2002/0197881 A1 | 12/2002 | Ramdani et al. | | 2004/0222476 A1 | 11/2004 | Ahn et al. |
| 2003/0001190 A1 | 1/2003 | Basceri et al. | | 2004/0248398 A1 | 12/2004 | Ahn et al. |
| 2003/0001241 A1 | 1/2003 | Chakrabarti et al. | | 2004/0262700 A1 | 12/2004 | Ahn et al. |
| 2003/0003722 A1 | 1/2003 | Vaartstra | | 2005/0009335 A1 | 1/2005 | Dean et al. |
| 2003/0003730 A1 | 1/2003 | Li | | 2005/0009370 A1 | 1/2005 | Ahn |
| 2003/0017717 A1 | 1/2003 | Ahn | | 2005/0020017 A1 | 1/2005 | Ahn et al. |
| 2003/0027360 A1 | 2/2003 | Hsu et al. | | 2005/0023574 A1 | 2/2005 | Forbes et al. |
| 2003/0042526 A1 | 3/2003 | Weimer | | 2005/0023584 A1 | 2/2005 | Derderian et al. |
| 2003/0043637 A1 | 3/2003 | Forbes et al. | | 2005/0023594 A1 | 2/2005 | Ahn et al. |
| 2003/0045060 A1 | 3/2003 | Ahn et al. | | 2005/0023595 A1 | 2/2005 | Forbes et al. |
| 2003/0045078 A1 | 3/2003 | Ahn et al. | | 2005/0023602 A1 | 2/2005 | Forbes et al. |

| | | |
|---|---|---|
| 2005/0023603 A1 | 2/2005 | Eldridge et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0023627 A1 | 2/2005 | Ahn et al. |
| 2005/0026349 A1 | 2/2005 | Forbes et al. |
| 2005/0026374 A1 | 2/2005 | Ahn et al. |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0030825 A1 | 2/2005 | Ahn |
| 2005/0032292 A1 | 2/2005 | Ahn et al. |
| 2005/0034662 A1 | 2/2005 | Ahn |
| 2005/0054165 A1 | 3/2005 | Ahn et al. |
| 2005/0077519 A1 | 4/2005 | Ahn et al. |
| 2005/0087134 A1 | 4/2005 | Ahn |
| 2005/0124174 A1 | 6/2005 | Ahn et al. |
| 2005/0138262 A1 | 6/2005 | Forbes |
| 2005/0145957 A1 | 7/2005 | Ahn et al. |
| 2005/0145959 A1 | 7/2005 | Forbes |
| 2005/0158973 A1 | 7/2005 | Ahn et al. |
| 2005/0227442 A1 | 10/2005 | Ahn et al. |
| 2005/0260357 A1 | 11/2005 | Olsen et al. |
| 2005/0285225 A1 | 12/2005 | Ahn et al. |
| 2006/0028867 A1 | 2/2006 | Forbes et al. |
| 2006/0028869 A1 | 2/2006 | Forbes et al. |
| 2006/0125030 A1 | 6/2006 | Ahn et al. |
| 2006/0128168 A1 | 6/2006 | Ahn et al. |
| 2006/0148180 A1 | 7/2006 | Ahn et al. |
| 2006/0176645 A1 | 8/2006 | Ahn et al. |
| 2006/0177975 A1 | 8/2006 | Ahn et al. |
| 2006/0189154 A1 | 8/2006 | Ahn et al. |
| 2006/0223337 A1 | 10/2006 | Ahn et al. |
| 2006/0228868 A1 | 10/2006 | Ahn et al. |
| 2006/0245984 A1 | 11/2006 | Kulkarni et al. |
| 2006/0261397 A1 | 11/2006 | Ahn et al. |
| 2006/0263972 A1 | 11/2006 | Ahn et al. |
| 2006/0264064 A1 | 11/2006 | Ahn et al. |
| 2006/0270147 A1 | 11/2006 | Ahn et al. |
| 2006/0281330 A1 | 12/2006 | Ahn et al. |
| 2007/0007560 A1 | 1/2007 | Forbes et al. |
| 2007/0007635 A1 | 1/2007 | Forbes et al. |
| 2007/0010060 A1 | 1/2007 | Forbes et al. |
| 2007/0010061 A1 | 1/2007 | Forbes et al. |
| 2007/0018214 A1 | 1/2007 | Ahn |
| 2007/0037415 A1 | 2/2007 | Ahn et al. |
| 2007/0045676 A1 | 3/2007 | Forbes et al. |
| 2007/0045752 A1 | 3/2007 | Forbes et al. |
| 2007/0048926 A1 | 3/2007 | Ahn |
| 2007/0049023 A1 | 3/2007 | Ahn et al. |
| 2007/0049051 A1 | 3/2007 | Ahn et al. |
| 2007/0049054 A1 | 3/2007 | Ahn et al. |
| 2007/0059881 A1 | 3/2007 | Ahn et al. |
| 2007/0087563 A1 | 4/2007 | Ahn et al. |
| 2007/0090439 A1 | 4/2007 | Ahn et al. |
| 2007/0090440 A1 | 4/2007 | Ahn et al. |
| 2007/0090441 A1 | 4/2007 | Ahn et al. |
| 2007/0092989 A1 | 4/2007 | Kraus et al. |
| 2007/0099366 A1 | 5/2007 | Ahn et al. |
| 2007/0101929 A1 | 5/2007 | Ahn et al. |
| 2007/0107661 A1 | 5/2007 | Ahn |
| 2007/0111544 A1 | 5/2007 | Ahn |
| 2007/0131169 A1 | 6/2007 | Ahn |
| 2007/0134931 A1 | 6/2007 | Ahn et al. |
| 2007/0134942 A1 | 6/2007 | Ahn et al. |
| 2007/0158765 A1 | 7/2007 | Ahn et al. |
| 2007/0181931 A1 | 8/2007 | Ahn et al. |
| 2007/0187772 A1 | 8/2007 | Ahn et al. |
| 2007/0187831 A1 | 8/2007 | Ahn et al. |
| 2007/0234949 A1 | 10/2007 | Ahn et al. |

FOREIGN PATENT DOCUMENTS

| | | |
|---|---|---|
| EP | 1096042 | 5/2001 |
| WO | WO-01/97257 | 12/2001 |
| WO | WO-02/31875 | 4/2002 |
| WO | WO-02/43115 | 5/2002 |

OTHER PUBLICATIONS

Aarik, Jaan, et al., "Texture Development in nanocrystalline hafnium dioxide thin films grown by atomic layer deposition", *Journal of Crystal Growth*, 220, (2000), 105-113.

Ahn, Kie Y., "ALD of Amorphous Lanthanide Doped $TiO_x$ Films", U.S. Appl. No. 11/092,072; filed Mar. 29, 2005.

Ahn, "Atomic Layer Deposited Dielectric Layers", U.S. Appl. No. 10/379,470, filed Mar. 4, 2003.

Ahn, Kie Y., "Atomic Layer Deposited Hafnium Tantalum Oxide Dielectrics", U.S. Appl. No. 11/029,757, filed Jan. 5, 2005.

Ahn, Kie Y., "Atomic Layer Deposited Lanthanium Aluminum Oxide Dielectric Layer", U.S. Appl. No. 10/930,167, filed Aug. 31, 2004.

Ahn, Kie Y., "Atomic Layer Deposited Lanthanum Hafnium Oxide Dielectrics", U.S. Appl. No. 11/010,529, filed Dec. 13, 2004.

Ahn, Kie Y., "Atomic Layer Deposited Titanium Aluminum Oxide Films", U.S. Appl. No. 10/931,533, filed Aug. 31, 2004.

Ahn, Kie Y., "Atomic Layer Deposition of $Hf_3N_4/HfO_2$ Films as Gate Dielectrics", U.S. Appl. No. 11/063,717, filed Feb. 23, 2005.

Ahn, Kie Y., et al., "Atomic Layer Deposition of Zirconium-Doped Tantalum Oxide Films", U.S. Appl. No. 10/909,959, filed Aug. 2, 2004.

Ahn, Kie Y., "Atomic Layer Deposition of $Zr_3N_4/ZrO_2$ Films as Gate Dielectrics", U.S. Appl. No. 11/058,563, filed Feb. 15, 2005.

Ahn, Kie Y., "Hybrid ALD-CVD of $Pr_xO_y/ZrO_2$ Films as Gate Dielectrics", U.S. Appl. No. 11/010,766, filed Dec. 13, 2004.

Ahn, "Iridium / Zirconium Oxide Structure", U.S. Appl. No. 11/152,759, filed Jun. 14, 2005.

Ahn, Kie Y., "Lanthanide Yttrium Aluminum Oxide Dielectric Films", U.S. Appl. No. 11/297,567, filed Dec. 8, 2005.

Ahn, Kie Y., "Magnesium Titanium Oxide Films", U.S. Appl. No. 11/189,075, filed Jul. 25, 2005.

Ahn, "Lanthanum Aluminum Oxynitride Dielectric Films", U.S. Appl. No. 11/216,474, filed Aug. 31, 2005.

Ahn, Kie Y., "Ruthenium Gate for a Lanthanide Oxide Dielectric Layer", U.S. Appl. No. 10/926,812, filed Aug. 26, 2004.

Chambers, J J., et al., "Physical and electrical characterization of ultrathin yttrium silicate insulators on silicon", *Journal of Applied Physics*, 90(2), (Jul. 15, 2001), 918-33.

Cheng, Baohong, et al., "The Impact of High-k Gate Dielectrics and Metal Gate Electrodes on Sub-100nm MOSFET's", *IEEE Transactions on Electron Devices*, 46(7), (Jul. 1999), 1537-1544.

Clark-Phelps, R. B., et al., "Engineered Tatalum Aluminate and Hafnium Aluminate ALD Films for Ultrathin Dielectric Films With Improved Electric and Thermal Properties", *Gate Stack and Silicide Issues in Silicon Processing II. Symposium (Materials Research Society Symposium Proceedings vol. 670)*, (Apr. 17, 2001), K2.2.1-6.

Desu, S B., "Minimization of Fatigue in Ferroelectric Films", *Physica Status Solidi A*, 151(2), (1995), 467-480.

Fuyuki, Takashi, et al., "Electronic Properties of the Interface between Si and $TiO_2$ Deposited at Very Low Temperatures", *Japanese Journal of Applied Physics*, 25(9), (1986), 1288-1291.

Gartner, M., et al., "Spectroellipsometric characterization of lanthanide-doped $TiO_2$ films obtained via the sol-gel technique", *Thin Solid Films*, 234(1-2), (1993), 561-565.

Gealy, et al., "Graded Dielectric Layers", U.S. Appl. No. 11/216,542, filed Aug. 30, 2005.

Geller, S., et al., "Crystallographic Studies of Perovskite-like Compounds. II. Rare Earth Aluminates", *Acta Cryst.*, 9, (May 1956), 1019-1025.

Giess, E. A., et al., "Lanthanide gallate perovskite-type substrates for epitaxial, high-$T_c$ superconducting $Ba_2YCu_3O_7$ delta films", *IBM Journal of Research and Development*, 34(6), (Nov. 1990), 916-926.

Hubbard, K. J., et al., "Thermodynamic stability of binary oxides in contact with silicon", *Journal of Materials Research*, 11(11), (Nov. 1996),2757-2776.

Iddles, D M., et al., "Relationships between dopants, microstructure and the microwave dielectric properties of $ZrO_2$—$TiO_2$-$SnO_2$ ceramics", *Journal of Materials Science*, 27(23), (Dec. 1992),6303-6310.

Jeon, Sanghun, et al., "Excellent electrical characteristics of lanthanide (Pr, Nd, Sm, Gd, and Dy) oxide and lanthanide-doped oxide for MOS gate dielectric applications", *Electron Devices Meeting, 2001, IEDM Technical Digest. International*, (2001),471-474.

Keomany, D., et al., "Sol gel preparation of mixed cerium-titanium oxide thin films", *Solar Energy Materials and Solar Cells*, 33(4), (Aug. 1994),429-441.

Kraus, Brenda, "Conductive Nanoparticles", U.S. Appl. No. 11/197,184, filed Aug. 4, 2005.

Kukli, Kaupo, "Atomic Layer Deposition of Titanium Oxide from $TiI_4$ and $H_2O_2$", *Chemical Vapor Deposition*, 6(6), (2000),303-310.

Kukli, K., et al., "Controlled growth of yttrium oxysulphide thin films by atomic layer deposition", *Materials Science Forum*, 315-317, (1999),216-221.

Kukli, Kaupo, "Low-Temperature Deposition of Zirconium Oxide-Based Nanocrystalline Films by Alternate Supply of $Zr[OC(CH_3)_3]_4$ and $H_2O$", *Chemical Vapor Deposition*, 6(6), (2000),297-302.

Kwo, J., et al., "High E gate dielectrics $Gd_2O_3$ and $Y_2O_3$ for silicon", *Applied Physics Letters*, 77(1), (Jul. 3, 2000),130-132.

Kwo, J., "Properties of high k gate dielectrics $Gd_2O_3$ and $Y_2O_3$ for Si", *Journal of Applied Physics*, 89(7), (2001),3920-3927.

Lee, Dong H., et al., "Metalorganic chemical vapor deposition of $TiO_2$:N anatase thin film on Si substrate", *Appl. Phys. Lett.*, 66(7), (Feb. 1995),815-816.

Leskela, M., "ALD precursor chemistry: Evolution and future challenges", *J. Phys. IV France*, 9, (1999),837-852.

Maria, J. P., et al., "High temperature stability in lanthanum and zirconia-based gate dielectrics", *Journal of Applied Physics*, 90(7), (Oct. 1, 2001),3476-3482.

Martin, P J., et al., "Ion-beam-assisted deposition of thin films", *Applied Optics*, 22(1), (Jan. 1983),178-184.

Molsa, Heini, et al., "Growth of yttrium oxide thin films from beta - diketonate precursor", *Advanced Materials for Optics and Electronics*, 4(6), (Nov.-Dec. 1994),389-400).

Muller, D. A., "The electronic structure at the atomic scale of ultrathin gate oxides", *Nature*, 399, (Jun. 24, 1999),758-61.

Nieminen, Minna, et al., "Formation and stability of lanthanum oxide thin films deposited from B-diketonate precursor", *Applied Surface Science*, 174(2), (Apr. 16, 2001),155-165.

Niilisk, A, "Atomic-scale optical monitoring of the initial growth of $TiO_2$ thin films", *Proceedings of the SPIE—The International Society for Optical Engineering*, 4318, (2001),72-77.

Oh, C B., et al., "Manufacturable embedded CMOS 6T-SRAM technology with high-k gate dielectric device for system-on-chip applications", *Technical Digest of International Electron Devices Meeting 2002*, (2002),423-426.

Ohmi, S., et al., "Rare Earth Metal Oxides for High-K Gate Insulator", *Electrochemical Society Proceedings*, vol. 2002-2, (2002),376-387.

Osten, H J., et al., "High-k Gate Dielectrics with Ultra-low Leakage Current Based on Praseodymium Oxide", *Technical Digest of IEDM*, (2000),653-656.

Rahtu, Antti, "Atomic Layer Deposition of Zirconium Titanlium Oxide from Titanium Isopropoxide and Zirconium Chloride", *Chemistry of Materials*, 13(5), (May 2001),1528-1532.

Ritala, Mikko, "Atomic Layer Epitaxy Growth of Titanium, Zirconium and Hafnium Dioxide Thin Films", *Annales Academiae Scientiarum Fennicae*, (1994),24-25.

Smith, Ryan C., "Chemical Vapour Deposition of the Oxides of Titanium, Zirconium and Hafnium for Use as High-k Materials in Microelectronic Devices. A Carbon-free Precursor for the Synthesis of Hafnium Dioxide", *Advanced Materials for Optics and Electronics*, 10(3-5), (2000),105-114.

Sneh, Ofer, "Thin film atomic layer deposition equipment for semiconductor processing", *Thin Solid Films*, 402(1-2), (2002),248-261.

Song, Hyun-Jung, et al., "Atomic Layer Deposition of $Ta_2O_5$ Films Using $Ta(OC_2H_5)_5$ and $NH_3$", *Ultrathin $SiO_2$ and High-K Materials for ULSI Gate Dielectrics. Symposium*, (1999),469-471.

Suntola, T., "Atomic Layer Epitaxy", *Handbook of Crystal Growth, 3; Thin Films of Epitaxy, Part B; Growth Mechanics and Dynamics*, Amsterdam,(1994),601-663.

Suntola, Tuomo, "Atomic layer epitaxy", *Thin Solid Films*, 216(1), (Aug. 28, 1992),84-89.

Tarre, A, et al., "Comparative study of low-temperature chloride atomic-layer chemical vapor deposition of $TiO_2$ and $SnO_2$", *Applied Surface Science*, 175-176, (May 2001),111-116.

Van Dover, R B., "Amorphous lanthanide-doped TiOx dielectric films", *Applied Physics Letters*, 74(20), (May 1999),3041-3043.

Viirola, H, "Controlled growth of antimony-doped tin dioxide thin films by atomic layer epitaxy", *Thin Solid Films*, 251, (Nov. 1994),127-135.

Viirola, H, et al., "Controlled growth of tin dioxide thin films by atomic layer epitaxy", *Thin Solid Films*, 249(2), (Sep. 1994),144-149.

Visokay, M R., "Application of HfSiON as a gate dielectric material", *Applied Physics Letters*, 80(17), (Apr. 2002),3183-3185.

Wilk, G. D., "High-K gate dielectrics: Current status and materials properties considerations", *Journal of Applied Physics*, 89(10), (May 2001),5243-5275.

Wolf, S., et al., *Silicon Processing for the VLSI Era—vol. 4: Deep-Submicron Process Technology*, Lattice Press, Sunset Beach, CA,(2002),p. 98, 146 173-174.

* cited by examiner

US 7,388,246 B2

LANTHANIDE DOPED TIO$_x$ DIELECTRIC FILMS

RELATED APPLICATIONS

This application is a divisional under 37 CFR 1.53(b) of U.S. application Ser. No. 10/233,309, filed Aug. 29, 2002, now U.S. Pat. No. 7,084,078, which application is incorporated herein by reference.

This application is related to the following, commonly assigned applications, incorporated herein by reference:

U.S. application Ser. No. 10/219,870, issued as U.S. Pat. No. 6,884,739, entitled: "Lanthanide doped TiO$_x$ Dielectric Films By Plasma Oxidation,"

U.S. application Ser. No. 10/219,878, issued as U.S. Pat. No. 6,790,791, entitled: "Lanthanide doped TiO$_x$ Dielectric Films,"

U.S. application Ser. No. 10/137,058, entitled: "Atomic Layer Deposition and Conversion,"

U.S. application Ser. No. 10/137,168, issued as U.S. Pat. No. 7,160,577, entitled: "Methods, Systems, and Apparatus for Atomic-Layer Deposition of Aluminum Oxides in Integrated Circuits," and U.S. application Ser. No. 09/797,324, issued as U.S. Pat. No. 6,852,167, entitled: "Methods, Systems, and Apparatus for Uniform Chemical-Vapor Depositions."

FIELD OF THE INVENTION

The invention relates to semiconductor devices and device fabrication. Specifically, the invention relates to gate dielectric layers and their method of fabrication.

BACKGROUND OF THE INVENTION

The semiconductor device industry has a market driven need to improve speed performance, improve its low static (off-state) power requirements, and adapt to a wide range of power supply and output voltage requirements for it silicon based microelectronic products. In particular, in the fabrication of transistors, there is continuous pressure to reduce the size of devices such as transistors. The ultimate goal is to fabricate increasingly smaller and more reliable integrated circuits (ICs) for use in products such as processor chips, mobile telephones, and memory devices such as dynamic random access memories (DRAMs). The smaller devices are frequently powered by batteries, where there is also pressure to reduce the size of the batteries, and to extend the time between battery charges. This forces the industry to not only design smaller transistors, but to design them to operate reliably with lower power supplies.

Currently, the semiconductor industry relies on the ability to reduce or scale the dimensions of its basic devices, primarily, the silicon based metal-oxide-semiconductor field effect transistor (MOSFET). A common configuration of such a transistor is shown in FIG. 1. While the following discussion uses FIG. 1 to illustrate a transistor from the prior art, one skilled in the art will recognize that the present invention could be incorporated into the transistor shown in FIG. 1 to form a novel transistor according to the invention. A transistor 100 is fabricated in a substrate 110 that is typically silicon, but could be fabricated from other semiconductor materials as well. Transistor 100 has a source region 120 and a drain region 130. A body region 132 is located between source region 120 and drain region 130, where body region 132 defines a channel of the transistor with a channel length 134. A gate dielectric 140 is located on body region 132 with a gate 150 located over gate dielectric 140. Although gate dielectric 140 can be formed from materials other than oxides, gate dielectric 140 is typically an oxide, and is commonly referred to as a gate oxide. Gate 150 may be fabricated from polycrystalline silicon (polysilicon), or other conducting materials such as metal may be used.

In fabricating transistors to be smaller in size and reliably operate on lower power supplies, one important design criteria is gate dielectric 140. The mainstay for forming the gate dielectric has been silicon dioxide, SiO$_2$. A thermally grown amorphous SiO$_2$ layer provides an electrically and thermodynamically stable material, where the interface of the SiO$_2$ layer with underlying Si provides a high quality interface as well as superior electrical isolation properties. In typical processing, use of SiO$_2$ on Si has provided defect charge densities on the order of $10^{10}/cm^2$, midgap interface state densities of approximately $10^{10}/cm^2$ eV, and breakdown voltages in the range of 15 MV/cm. With such qualities, there would be no apparent need to use a material other than SiO$_2$, but increased scaling and other requirements for gate dielectrics create the need to find other dielectric materials to be used for a gate dielectric.

DETAILED DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1:
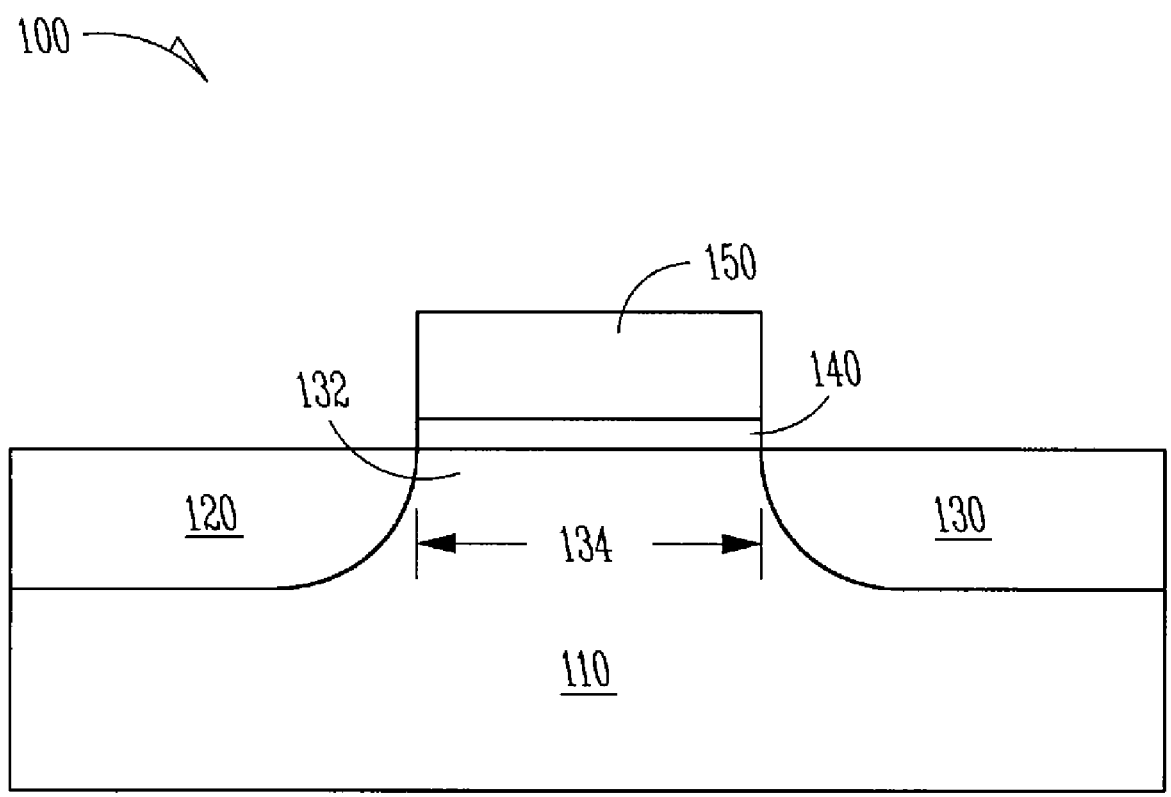
FIG. 1 shows a common configuration of a transistor in which an embodiment of a gate dielectric containing atomic layer deposited lanthanide doped TiO$_x$ can be formed according to the teachings of the present invention.

A gate dielectric 140 of FIG. 1, when operating in a transistor, has both a physical gate dielectric thickness and an equivalent oxide thickness ($t_{eq}$). The equivalent oxide thickness quantifies the electrical properties, such as capacitance, of a gate dielectric 140 in terms of a representative physical thickness. $t_{eq}$ is defined as the thickness of a theoretical $SiO_2$ layer that would be required to have the same capacitance density as a given dielectric, ignoring leakage current and reliability considerations.

A $SiO_2$ layer of thickness, t, deposited on a Si surface as a gate dielectric will have a $t_{eq}$ larger than its thickness, t. This $t_{eq}$ results from the capacitance in the surface channel on which the $SiO_2$ is deposited due to the formation of a depletion/inversion region. This depletion/inversion region can result in $t_{eq}$ being from 3 to 6 Angstroms (Å) larger than the $SiO_2$ thickness, t. Thus, with the semiconductor industry driving to someday scale the gate dielectric equivalent oxide thickness to under 10 Å, the physical thickness requirement for a $SiO_2$ layer used for a gate dielectric would be need to be approximately 4 to 7 Å.

Additional requirements on a $SiO_2$ layer would depend on the gate electrode used in conjunction with the $SiO_2$ gate dielectric. Using a conventional polysilicon gate would result in an additional increase in $t_{eq}$ for the $SiO_2$ layer. This additional thickness could be eliminated by using a metal gate electrode, though metal gates are not currently used in typical complementary metal-oxide-semiconductor field effect transistor (CMOS) technology. Thus, future devices would be designed towards a physical $SiO_2$ gate dielectric layer of about 5 Å or less. Such a small thickness requirement for a $SiO_2$ oxide layer creates additional problems.

Silicon dioxide is used as a gate dielectric, in part, due to its electrical isolation properties in a $SiO_2$—Si based structure. This electrical isolation is due to the relatively large band gap of $SiO_2$ (8.9 eV) making it a good insulator from electrical conduction. Signification reductions in its band gap would eliminate it as a material for a gate dielectric. As the thickness of a $SiO_2$ layer decreases, the number of atomic layers, or monolayers of the material in the thickness decreases. At a certain thickness, the number of monolayers will be sufficiently small that the $SiO_2$ layer will not have a complete arrangement of atoms as in a larger or bulk layer. As a result of incomplete formation relative to a bulk structure, a thin $SiO_2$ layer of only one or two monolayers will not form a full band gap. The lack of a full band gap in a $SiO_2$ gate dielectric would cause an effective short between an underlying Si channel and an overlying polysilicon gate. This undesirable property sets a limit on the physical thickness to which a $SiO_2$ layer can be scaled. The minimum thickness due to this monolayer effect is thought to be about 7-8 Å. Therefore, for future devices to have a $t_{eq}$ less than about 10 Å, other dielectrics than $SiO_2$ need to be considered for use as a gate dielectric.

For a typical dielectric layer used as a gate dielectric, the capacitance is determined as one for a parallel plate capacitance: $C = \kappa \epsilon_0 A/t$, where $\kappa$ is the dielectric constant, $\epsilon_0$ is the permittivity of free space, A is the area of the capacitor, and t is the thickness of the dielectric. The thickness, t, of a material is related to its $t_{eq}$ for a given capacitance, with $SiO_2$ having a dielectric constant $\kappa_{ox} = 3.9$, as $$t = (\kappa/\kappa_{ox}) t_{eq} = (\kappa/3.9) t_{eq}.$$

Thus, materials with a dielectric constant greater than that of $SiO_2$, 3.9, will have a physical thickness that can be considerably larger than a desired $t_{eq}$, while providing the desired equivalent oxide thickness. For example, an alternate dielectric material with a dielectric constant of 10 could have a thickness of about 25.6 Å to provide a $t_{eq}$ of 10 Å, not including any depletion/inversion layer effects. Thus, a reduced equivalent oxide thickness for transistors can be realized by using dielectric materials with higher dielectric constants than $SiO_2$.

The thinner equivalent oxide thickness required for lower transistor operating voltages and smaller transistor dimensions may be realized by a significant number of materials, but additional fabricating requirements makes determining a suitable replacement for $SiO_2$ difficult. The current view for the microelectronics industry is still for Si based devices. This requires that the gate dielectric employed be grown on a silicon substrate or silicon layer, which places significant restraints on the substitute dielectric material. During the formation of the dielectric on the silicon layer, there exists the possibility that a small layer of $SiO_2$ could be formed in addition to the desired dielectric. The result would effectively be a dielectric layer consisting of two sublayers in parallel with each other and the silicon layer on which the dielectric is formed. In such a case, the resulting capacitance would be that of two dielectrics in series. As a result, the $t_{eq}$ of the dielectric layer would be the sum of the $SiO_2$ thickness and a multiplicative factor of the thickness of the dielectric being formed, written as $$t_{eq} = t_{SiO2} + (\kappa_{ox}/\kappa) t.$$

Thus, if a $SiO_2$ layer is formed in the process, the $t_{eq}$ is again limited by a $SiO_2$ layer. In the event that a barrier layer is formed between the silicon layer and the desired dielectric in which the barrier layer prevents the formation of a SiO$_2$ layer, the t$_{eq}$ would be limited by the layer with the lowest dielectric constant. However, whether a single dielectric layer with a high dielectric constant or a barrier layer with a higher dielectric constant than SiO$_2$ is employed, the layer interfacing with the silicon layer must provide a high quality interface to maintain a high channel carrier mobility.

In a recent article by G. D. Wilk et al., *Journal of Applied Physics,* vol. 89: no. 10, pp. 5243-5275 (2001), material properties of high dielectric materials for gate dielectrics were discussed. Among the information disclosed was the viability of Al$_2$O$_3$ as a substitute for SiO$_2$. Al$_2$O$_3$ was disclosed has having favourable properties for use as a gate dielectric such as high band gap, thermodynamic stability on Si up to high temperatures, and an amorphous structure. In addition, Wilk disclosed that forming a layer of Al$_2$O$_3$ on silicon does not result in a SiO$_2$ interfacial layer. However, the dielectric constant of Al$_2$O$_3$ is only 9, where thin layers may have a dielectric constant of about 8 to about 10. Though the dielectric constant of Al$_2$O$_3$ is in an improvement over SiO$_2$, a higher dielectric constant for a gate dielectric is desirable. Other dielectrics and their properties discussed by Wilk include

| Material | Dielectric Constant (κ) | Band gap E$_g$ (eV) | Crystal Structure(s) |
|---|---|---|---|
| SiO$_2$ | 3.9 | 8.9 | Amorphous |
| Si$_3$N$_4$ | 7 | 5.1 | Amorphous |
| Al$_2$O$_3$ | 9 | 8.7 | Amorphous |
| Y$_2$O$_3$ | 15 | 5.6 | Cubic |
| La$_2$O$_3$ | 30 | 4.3 | Hexagonal, Cubic |
| Ta$_2$O$_5$ | 26 | 4.5 | Orthorhombic |
| TiO$_2$ | 80 | 3.5 | Tetrag. (rutile, anatase) |
| HfO$_2$ | 25 | 5.7 | Mono., Tetrag., Cubic |
| ZrO$_2$ | 25 | 7.8 | Mono., Tetrag., Cubic |

One of the advantages using SiO$_2$ as a gate dielectric has been that the formation of the SiO$_2$ layer results in an amorphous gate dielectric. Having an amorphous structure for a gate dielectric is advantageous because grain boundaries in polycrystalline gate dielectrics provide high leakage paths. Additionally, grain size and orientation changes throughout a polycrystalline gate dielectric can cause variations in the film's dielectric constant. The abovementioned material properties including crystal structure are for the materials in a bulk form. The materials having the advantage of a high dielectric constants relative to SiO$_2$ also have the disadvantage of a crystalline form, at least in a bulk configuration. The best candidates for replacing SiO$_2$ as a gate dielectric are those with high dielectric constant, which can be fabricated as a thin layer with an amorphous form.

In one embodiment, a method of forming a dielectric film includes the formation of lanthanide doped TiO$_x$ by atomic layer deposition (ALD). The ALD formation of the lanthanide doped TiO$_x$ layer includes depositing titanium and oxygen onto a substrate surface by atomic layer deposition, and depositing a lanthanide dopant by atomic layer deposition onto the substrate surface containing the deposited titanium and oxygen. In one embodiment, the dopant is selected from a group consisting of Nd, Tb, and Dy. The lanthanide doped TiO$_x$ layer thickness is controlled by processing a total number of ALD cycles to produce the desired thickness.

A dielectric film containing lanthanide doped TiO$_x$ has a larger dielectric constant than silicon dioxide, a relatively small leakage current, and good stability with respect to a silicon based substrate. Embodiments include forming capacitors, transistors, memory devices, and electronic systems having dielectric layers containing atomic layer deposited lanthanide doped TiO$_x$.

Other embodiments include structures for capacitors, transistors, memory devices, and electronic systems with dielectric films containing atomic layer deposited lanthanide doped TiO$_x$. Such dielectric films provide a significantly thinner equivalent oxide thickness compared with a silicon oxide layer having the same physical thickness. Alternatively, such dielectric films provide a significantly thicker physical thickness than a silicon oxide layer having the same equivalent oxide thickness.

Based solely on the size of the dielectric constant, titanium oxide, TiO$_2$, appears to be an excellent candidate for replacing SiO$_2$. However, TiO$_2$ does not provide the electrical properties generally desired for integrated circuits, such as, high electric field breakdown and low leakage current. Dielectric films substituting various cations, including the lanthanides Nd, Tb, and Dy, into amorphous TiO$_x$ films by magnetron sputtering were found to provide improved electric field breakdown and leakage current with respect to undoped TiO$_2$ films. See, R. B. Dover, *Applied Physics Letters,* vol. 74: no. 20, pp. 3041-3043 (2001).

However, another consideration for selecting the material and method for forming a dielectric film for use in electronic devices and systems concerns the roughness of a dielectric film on a substrate. Surface roughness of the dielectric film has a significant effect on the electrical properties of the gate oxide, and the resulting operating characteristics of the transistor. The leakage current through a physical 1.0 nm gate oxide increases by a factor of 10 for every 0.1 increase in the root-mean-square (RMS) roughness.

During a conventional sputtering deposition process stage, particles of the material to be deposited bombard the surface at a high energy. When a particle hits the surface, some particles adhere, and other particles cause damage. High energy impacts remove body region particles creating pits. The surface of such a deposited layer can have a rough contour due to the rough interface at the body region.

In an embodiment according to the teachings of the present invention, a lanthanide doped TiO$_x$ dielectric film having a substantially smooth surface relative to other processing techniques is formed using atomic layer deposition (ALD). Further, forming a dielectric film using atomic layer deposition can provide for controlling transitions between material layers. Thus, atomic layer deposited lanthanide doped TiO$_x$ dielectric films can have an engineered transition with a substrate surface that has a substantially reduced or no interfacial SiO$_2$ layer.

ALD, also known as atomic layer epitaxy (ALE), was developed in the early 1970's as a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. Between the pulses, the reaction chamber is purged with a gas, which in many cases is an inert gas, or evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other on the substrate aggressively, one ALD cycle can be preformed in less than one second in properly designed flow type reaction chambers. Typically, precursor pulse times range from about 0.5 sec to about 2 to 3 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Significantly, ALD provides for controlling film thickness in a straightforward manner by controlling the number of growth cycles.

ALD was originally developed to manufacture luminescent and dielectric films needed in electroluminescent displays. Significant efforts have been made to apply ALD to the growth of doped zinc sulfide and alkaline earth metal sulfide films. Additionally, ALD has been studied for the growth of different epitaxial II-V and II-VI films, nonepitaxial crystalline or amorphous oxide and nitride films and multilayer structures of these. There also has been considerable interest towards the ALD growth of silicon and germanium films, but due to the difficult precursor chemistry, this has not been very successful.

The precursors used in an ALD process may be gaseous, liquid or solid. However, liquid or solid precursors must be volatile. The vapor pressure must be high enough for effective mass transportation. Also, solid and some liquid precursors need to be heated inside the reaction chamber and introduced through heated tubes to the substrates. The necessary vapor pressure must be reached at a temperature below the substrate temperature to avoid the condensation of the precursors on the substrate. Due to the self-limiting growth mechanisms of ALD, relatively low vapor pressure solid precursors can be used though evaporation rates may somewhat vary during the process because of changes in their surface area.

There are several other requirements for precursors used in ALD. The precursors must be thermally stable at the substrate temperature because their decomposition would destroy the surface control and accordingly the advantages of the ALD method which relies on the reaction of the precursor at the substrate surface. A slight decomposition, if slow compared to the ALD growth, can be tolerated.

The precursors have to chemisorb on or react with the surface, though the interaction between the precursor and the surface as well as the mechanism for the adsorption is different for different precursors. The molecules at the substrate surface must react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction must be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. The metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that are all identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle can be realized.

The advantages of RS-ALD include continuity at an interface, conformality over a substrate, use of low temperature and mildly oxidizing processes, growth thickness dependent solely on the number of cycles performed, and ability to engineer multilayer laminate films with resolution of one to two monolayers. RS-ALD allows for deposition control on the order on monolayers and the ability to deposit monolayers of amorphous films.

Herein, a sequence refers to the ALD material formation based on an ALD reaction of one precursor with its reactant precursor. For example, forming titanium oxide from a $TiI_4$ precursor and $H_2O_2$, as its reactant precursor, forms one embodiment of a titanium/oxygen sequence, which can also be referred to as titanium sequence. A cycle of a sequence includes pulsing a precursor, pulsing a purging gas for the precursor, pulsing a reactant precursor, and pulsing the reactant's purging gas.

In an embodiment, a layer of lanthanide doped $TiO_x$ is formed on a substrate mounted in a reaction chamber using ALD in a repetitive sequence using precursor gases individually pulsed into the reaction chamber. Alternately, solid or liquid precursors can be used in an appropriately designed reaction chamber. ALD formation of other materials is disclosed in co-pending, commonly assigned U.S. patent application: entitled "Atomic Layer Deposition and Conversion," Ser. No. 10/137,058, and "Methods, Systems, and Apparatus for Atomic-Layer Deposition of Aluminum Oxides in Integrated Circuits," Ser. No. 10/137,168, issued as U.S. Pat. No. 7,160,577.

Figure 2A:
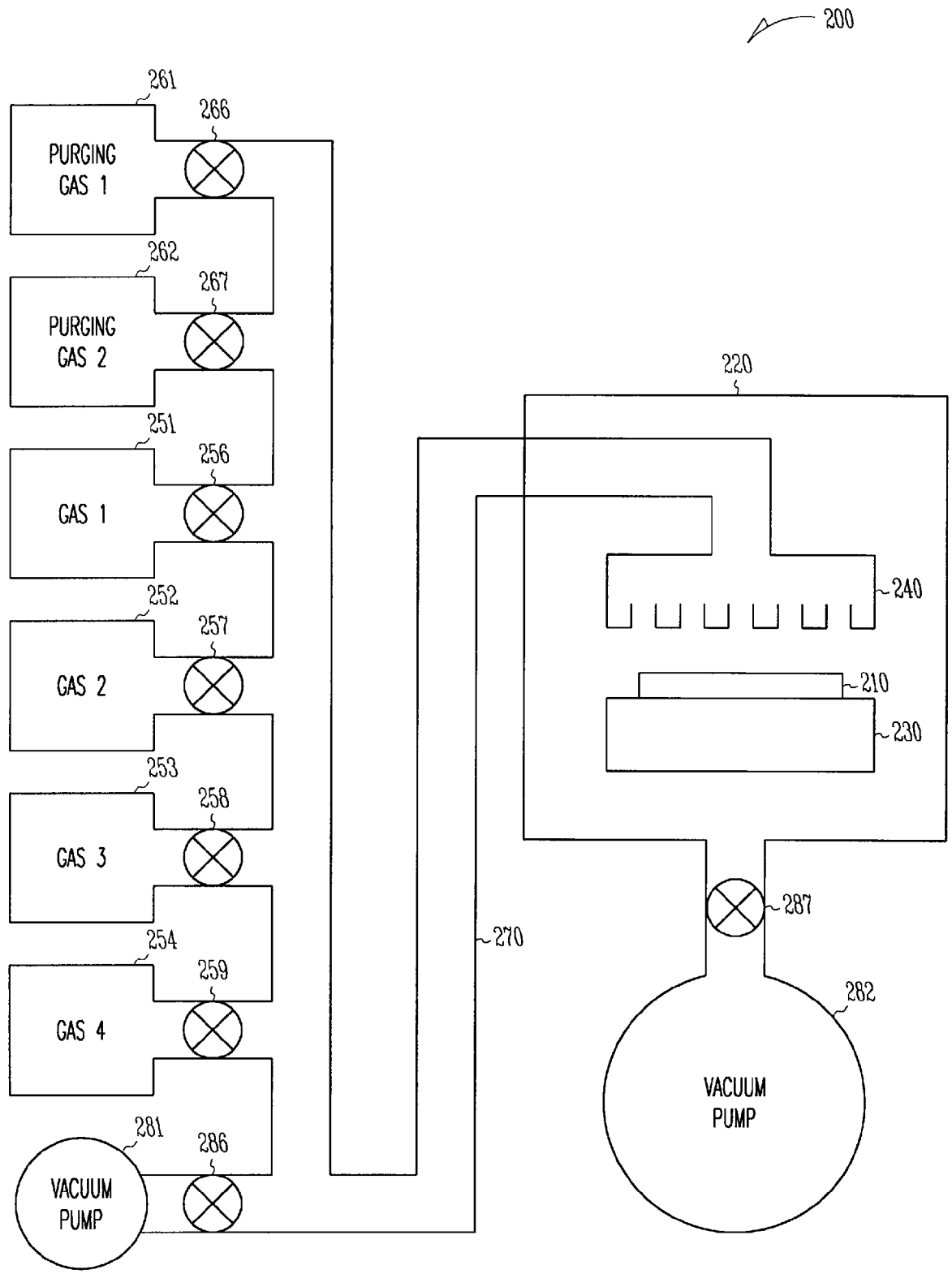
FIG. 2A shows an embodiment of an atomic layer deposition system for processing a dielectric film containing lanthanide doped TiO$_x$, according to the teachings of the present invention.

FIG. 2A shows an embodiment of an atomic layer deposition system 200 for processing a dielectric film containing lanthanide doped $TiO_x$. The elements depicted are those elements necessary for discussion of the present invention such that those skilled in the art may practice the present invention without undue experimentation. A further discussion of the ALD reaction chamber can be found in co-pending, commonly assigned U.S. patent application: entitled "Methods, Systems, and Apparatus for Uniform Chemical-Vapor Depositions," Ser. No. 09/797,324, now issued as U.S. Pat. No. 6,852,167, incorporated herein by reference.

In FIG. 2A, a substrate 210 is located inside a reaction chamber 220 of ALD system 200. Also located within the reaction chamber 220 is a heating element 230 which is thermally coupled to substrate 210 to control the substrate temperature. A gas-distribution fixture 240 introduces precursor gases to the substrate 210. Each precursor gas originates from individual gas sources 251-254 whose flow is controlled by mass-flow controllers 256-259, respectively. Gas sources 251-254 provide a precursor gas either by storing the precursor as a gas or by providing a location and apparatus for evaporating a solid or liquid material to form the selected precursor gas.

Also included in the ALD system are purging gas sources 261, 262, each of which is coupled to mass-flow controllers 266, 267, respectively. Furthermore, additional purging gas sources can be constructed in ALD system 200, one purging gas source for each precursor gas. For a process that uses the same purging gas for multiple precursor gases less purging gas sources are required for ALD system 200. Gas sources 251-254 and purging gas sources 261-262 are coupled by their associated mass-flow controllers to a common gas line or conduit 270 which is coupled to the gas-distribution fixture 240 inside the reaction chamber 220. Gas conduit 270 is also coupled to vacuum pump, or exhaust pump, 281 by mass-flow controller 286 to remove excess precursor gases, purging gases, and by-product gases at the end of a purging sequence from the gas conduit.

Vacuum pump, or exhaust pump, 282 is coupled by mass-flow controller 287 to remove excess precursor gases, purging gases, and by-product gases at the end of a purging sequence from reaction chamber 220. For convenience, control displays, mounting apparatus, temperature sensing devices, substrate maneuvering apparatus, and necessary electrical connections as are known to those skilled in the art are not shown in FIG. 2A.

Figure 2B:
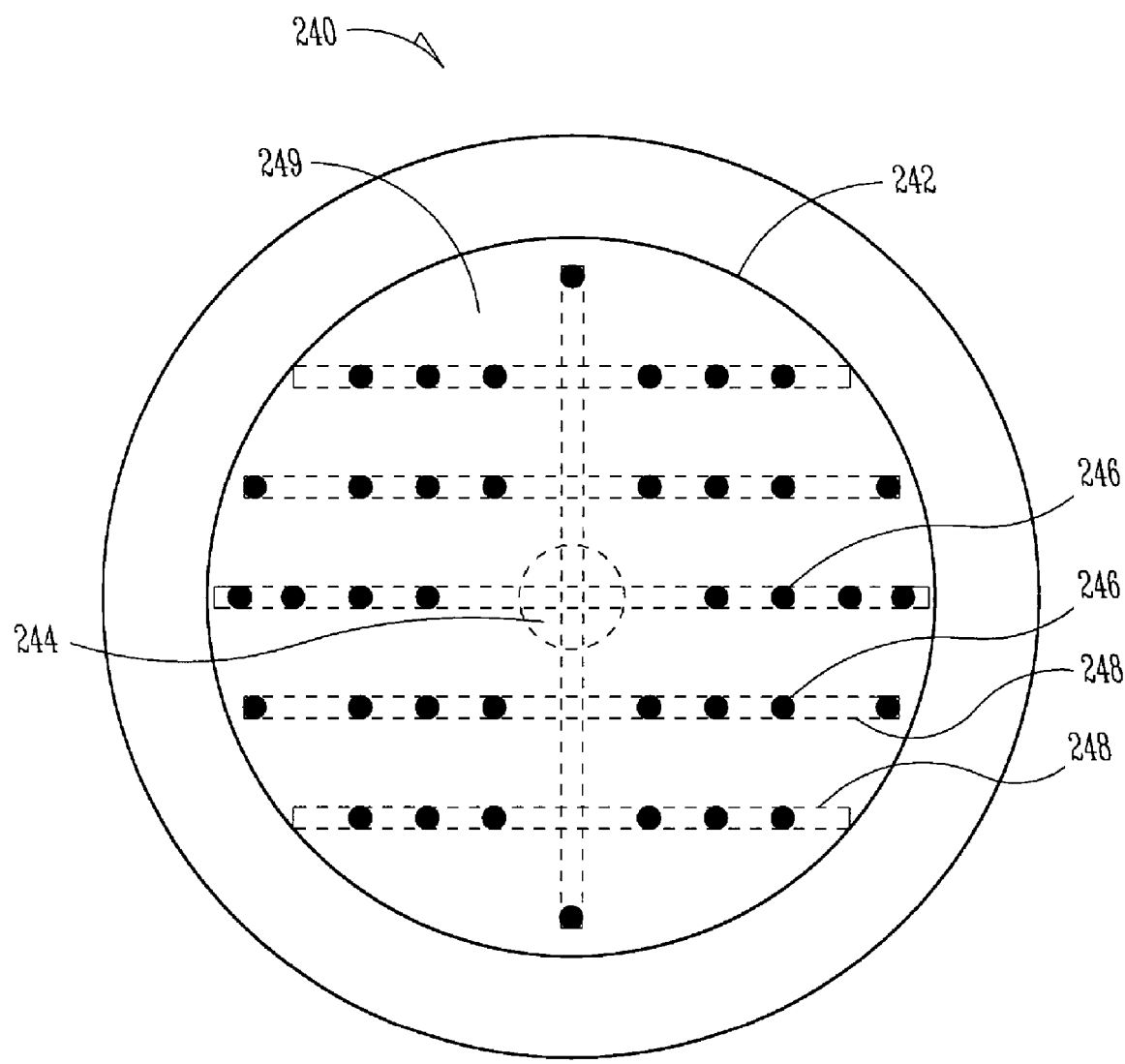
FIG. 2B shows an embodiment of a gas-distribution fixture of an atomic layer deposition system for processing a dielectric film containing lanthanide doped TiO$_x$, according to the teachings of the present invention.

FIG. 2B shows an embodiment of a gas-distribution fixture 240 of atomic layer deposition system 200 for processing a dielectric film containing lanthanide doped $TiO_x$. Gas-distribution fixture 240 includes a gas-distribution member 242, and a gas inlet 244. Gas inlet 244 couples gas-distribution member 242 to gas conduit 270 of FIG. 2A. Gas-distribution member 242 includes gas-distribution holes, or orifices, 246 and gas-distribution channels 248. In the exemplary embodiment, holes 246 are substantially circular with a common diameter in the range of 15-20 microns, gas-distribution channels 248 have a common width in the range of 20-45 microns. The surface 249 of gas distribution member 242 having gas-distribution holes 246 is substantially planar and parallel to substrate 210 of FIG. 2A. However, other embodiments use other surface forms as well as shapes and sizes of holes and channels. The distribution and size of holes may also affect deposition thickness and thus might be used to assist thickness control. Holes 246 are coupled through gas-distribution channels 248 to gas inlet 244. Though ALD system 200 is well suited for practicing the present invention, other ALD systems commercially available can be used.

The use, construction and fundamental operation of reaction chambers for deposition of films are understood by those of ordinary skill in the art of semiconductor fabrication. The present invention may be practiced on a variety of such reaction chambers without undue experimentation. Furthermore, one of ordinary skill in the art will comprehend the necessary detection, measurement, and control techniques in the art of semiconductor fabrication upon reading the disclosure.

The elements of ALD system 200 can be controlled by a computer. To focus on the use of ALD system 200 in the various embodiments of the present invention, the computer is not shown. Those skilled in the art can appreciate that the individual elements such as pressure control, temperature control, and gas flow within ALD system 200 can be under computer control. In one embodiment, instructions stored in a computer readable medium are executed by a computer to accurately control the integrated functioning of the elements of ALD system 200 to form a dielectric film containing lanthanide doped $TiO_x$.

In one embodiment, a method of forming a dielectric film includes depositing titanium and oxygen onto a substrate surface by atomic layer deposition and depositing a lanthanide dopant by atomic layer deposition onto the substrate surface containing the deposited titanium and oxygen. In one embodiment, the titanium sequence and the lanthanide dopant sequence include using precursors that form oxides of the titanium and the lanthanide dopant. For example, precursor $TiI_4$ with $H_2O_2$ as its reactant precursor in an ALD process can form $TiO_x$, and precursor $La(thd)_3$ (thd=2,2,6,6-tetramethyl-3,5-heptanedione) with ozone as its reactant precursor in an ALD process can form $La_2O_3$.

Depositing the lanthanide dopant includes regulating the deposition of the lanthanide dopant relative to the titanium and oxygen deposited on the substrate surface to form a dielectric layer containing $TiO_x$ doped with a predetermined percentage of the lanthanide. In a further embodiment, depositing a lanthanide dopant includes depositing a lanthanide selected from a group consisting of Nd, Tb, and Dy.

The lanthanide dopant can be included in the $TiO_x$ film using different embodiments for atomic layer deposition. In one embodiment, a lanthanide can be doped in the $TiO_x$ film by pulsing a lanthanide dopant sequence in place of a titanium sequence. The lanthanide dopant level is then controlled by regulating the number of cycles of the lanthanide dopant sequence with respect to the number of cycles of the titanium sequence. In another embodiment, a lanthanide can be doped in the $TiO_x$ film by pulsing a lanthanide dopant precursor substantially simultaneously with a titanium precursor. The titanium/lanthanide dopant sequence includes a precursor for oxidizing the titanium/lanthanide dopant at the substrate surface. The lanthanide dopant level is then controlled by regulating the mixture of the titanium containing precursor and the lanthanide containing precursor.

Figure 3A:
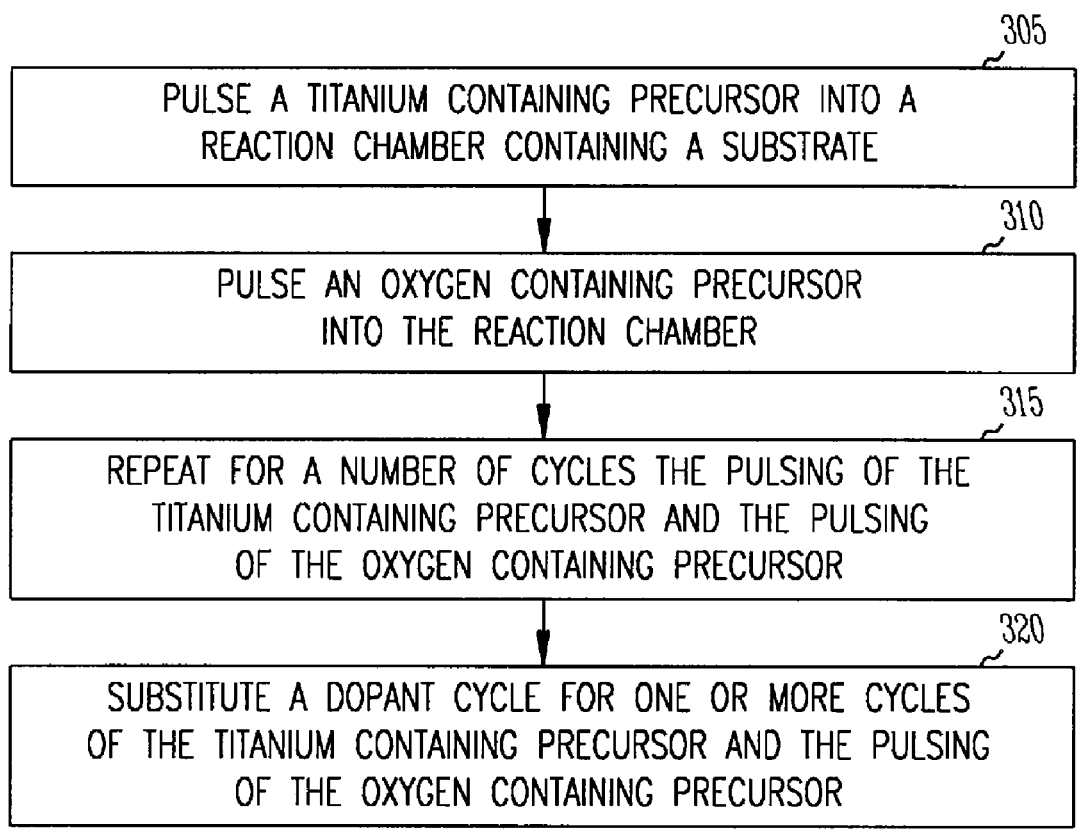
FIGS. 3A-3B illustrate flow diagrams of elements for an embodiment of a method to process a dielectric film containing lanthanide doped TiO$_x$ by atomic layer deposition, according to the teachings of the present invention.
Figure 3B:
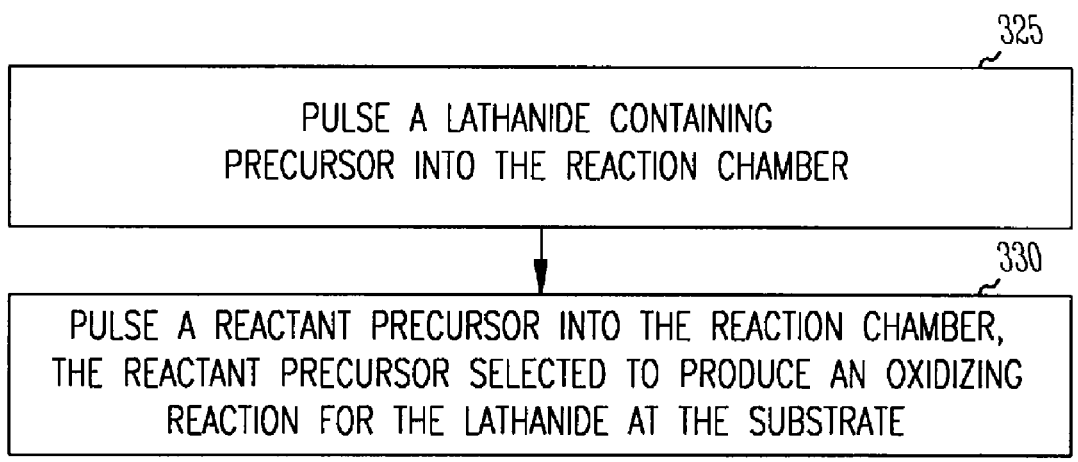

FIGS. 3A-3B illustrate flow diagrams of elements for an embodiment of a method to process a dielectric film containing lanthanide doped $TiO_x$ by atomic layer deposition. This embodiment for forming a lanthanide doped $TiO_x$ dielectric film by atomic layer deposition can include pulsing a titanium containing precursor into a reaction chamber containing a substrate, at block 305, pulsing an oxygen containing precursor into the reaction chamber, at block 310, repeating for a number of cycles the pulsing of the titanium containing precursor and the pulsing of the oxygen containing precursor, at block 315, and substituting a dopant cycle for one or more cycles of the pulsing of the titanium containing precursor and the pulsing of the oxygen containing precursor, at block 320. The dopant cycle includes pulsing a lanthanide dopant containing precursor into the reaction chamber, at block 325, and pulsing a reactant precursor into the reaction chamber, at block 330. The reactant precursor is selected to produce an oxidizing reaction for the lanthanide at the substrate. In one embodiment, the dopant is selected from a group consisting of Nd, Tb, and Dy.

Atomic layer deposition of the individual components of the lanthanide doped $TiO_x$ layer allows for individual control of each precursor pulsed into the reaction chamber. Thus, each precursor is pulsed into the reaction chamber for a predetermined period, where the predetermined period can be set separately for each precursor. Repeating the cycle for pulsing a titanium containing precursor and oxygen containing precursor results in a $TiO_x$ film whose film thickness is determined by the total number of cycles of the titanium/oxygen sequence completed.

To provide the dopant into this $TiO_x$ film, a variation to the repeated cycles is made. In the embodiment discussed above, doping is included in the atomic layer deposition process by pulsing a dopant containing precursor and reactant precursor in place of one or more cycles of the titanium sequence. Associated with the dopant cycle there is also a growth rate substantially constant at a fixed number of angstroms per cycle, for constant environmental conditions in the reaction chamber and constant sequencing parameters in the dopant cycle. However, when a combined cycle consists of a large number of cycles of a titanium sequence for one cycle of a lanthanide dopant cycle, the growth rate for forming the lanthanide doped $TiO_x$ dielectric film can be substantially the same as for an undoped $TiO_x$ dielectric film.

Depending on the percentage of the lanthanide dopant, the growth rate for the lanthanide doped $TiO_x$ dielectric film may vary between that of an undoped $TiO_x$ dielectric film towards that of an oxide of the lanthanide dopant. As an example, for a combined cycle having 100 cycles of a titanium sequence and 1 cycle of a lanthanide dopant sequence with a growth rate for the titanium sequence of about 1.2 Å/cycle, a dielectric film grown by ALD processing for 10 combined cycles would have a thickness of about 1200 Å. With a dielectric constant for lanthanide doped $TiO_x$ dielectric films ranging from about 50 to about 100, the dielectric film grown with 10 combined cycles has a $t_{eq}$ of about 93.6 Å to about 46.8 Å, respectively. As previously discussed, when the number of cycles for a dopant sequence is no longer small with respect to the number of cycles for a titanium sequence, growth rates can vary from that of an undoped $TiO_x$ dielectric film. As can be understood by those skilled in the art, particular growth rates can be determined during normal initial testing of the ALD system for processing a lanthanide doped $TiO_x$ dielectric film for a given application without undue experimentation.

Alternately, the lanthanide dopant containing precursor can be pulsed simultaneously with the titanium containing precursor. Then, following a gas purge, a reactant precursor that provides an ALD reaction for both the titanium containing precursor and the dopant precursor is pulsed into the reaction. The percentage of the lanthanide dopant can be controlled by regulating the percentage of the lanthanide dopant containing precursor in the precursor mixture that is injected into the reaction chamber to the substrate. The growth per cycle would then depend on the growth rate using the given mixture. As can be understood by those skilled in the art, determining the growth rate for a particular mixture can be determined during normal initial testing of the ALD system for processing a lanthanide doped $TiO_x$ dielectric film without undue experimentation.

Additionally, for an embodiment for ALD formation of a lanthanide doped $TiO_x$ layer, each precursor can be pulsed into the reaction under separate environmental conditions. The substrate can be maintained at a selected temperature and the reaction chamber maintained at a selected pressure independently for pulsing each precursor. Appropriate temperatures and pressures are maintained dependent on the nature of the precursor, whether the precursor is a single precursor or a mixture of precursors.

Using atomic layer deposition, the pulsing of the precursor gases is separated by purging the reaction chamber with a purging gas following each pulsing of a precursor. In one embodiment, nitrogen gas is used as the purging gas following the pulsing of each precursor used in a cycle to form a layer of lanthanide doped $TiO_x$. Additionally, the reaction chamber can also be purged by evacuating the reaction chamber.

Figure 4A:
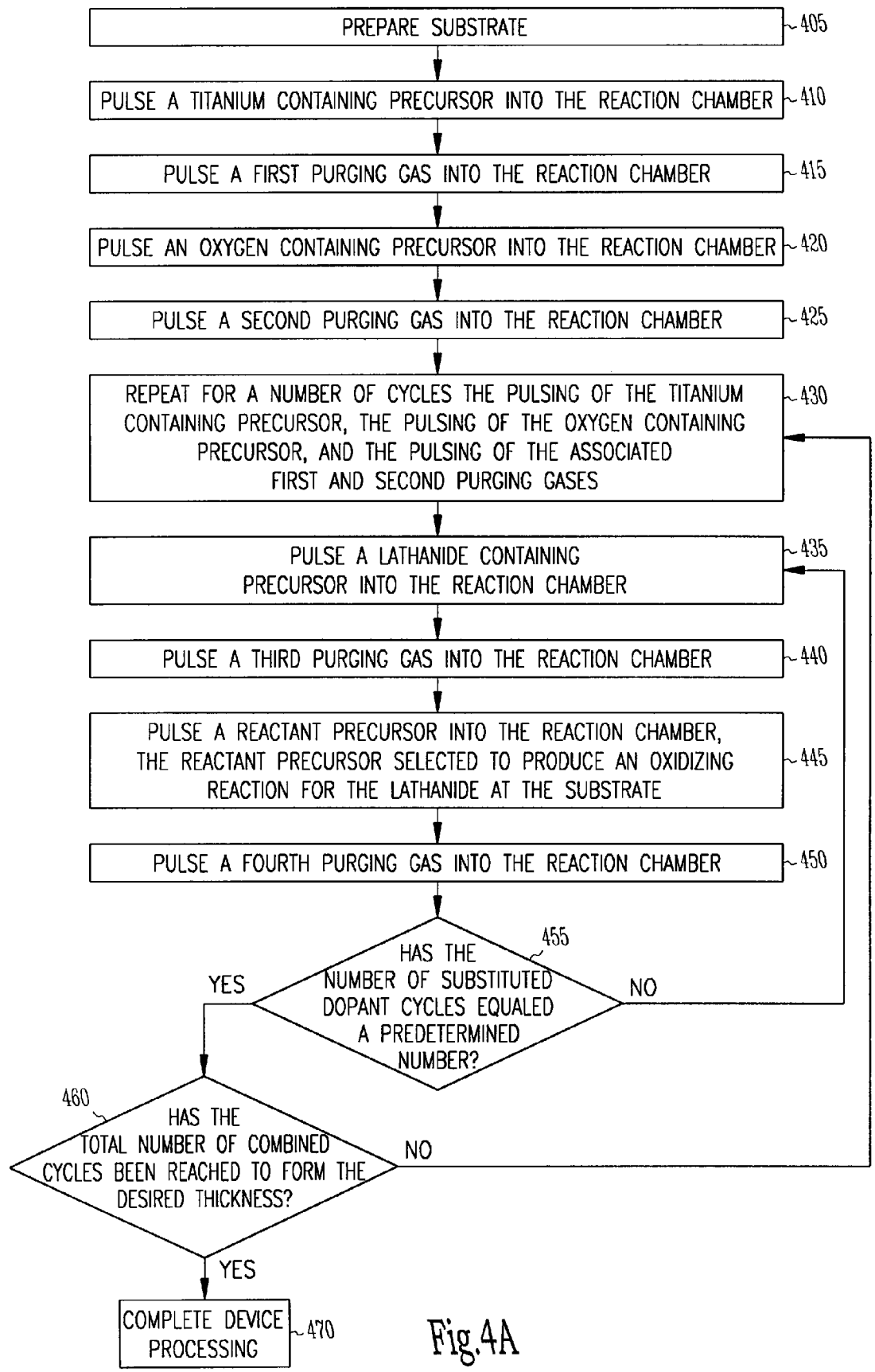
FIG. 4A illustrates a flow diagram of elements for another embodiment of a method to process a dielectric film containing TiO$_x$ doped with a lanthanide by atomic layer deposition, according to the teachings of the present invention.

FIG. 4A illustrates a flow diagram of elements for another embodiment of a method to process a dielectric film containing $TiO_x$ doped with a lanthanide by atomic layer deposition. This embodiment can be implemented with the atomic layer deposition system 200 of FIGS. 2A,B.

At block 405, a substrate 210 is prepared. The substrate used for forming a transistor is typically a silicon or silicon containing material. In other embodiments, germanium, gallium arsenide, silicon-on-sapphire substrates, or other suitable substrates may be used. This preparation process includes cleaning of substrate 210 and forming layers and regions of the substrate, such as drains and sources of a metal oxide semiconductor (MOS) transistor, prior to forming a gate dielectric. The sequencing of the formation of the regions of the transistor being processed follows typical sequencing that is generally performed in the fabrication of a MOS transistor as is well known to those skilled in the art. Included in the processing prior to forming a gate dielectric is the masking of substrate regions to be protected during the gate dielectric formation, as is typically performed in MOS fabrication. In this embodiment, the unmasked region includes a body region of a transistor, however one skilled in the art will recognize that other semiconductor device structures may utilize this process. Additionally, the substrate 210 in its ready for processing form is conveyed into a position in reaction chamber 220 for ALD processing.

At block 410, a titanium containing precursor is pulsed into reaction chamber 220. In an embodiment, $TiI_4$ is used as a precursor. The $TiI_4$ is pulsed into reaction chamber 220 through the gas-distribution fixture 240 onto substrate 210. The flow of the $TiI_4$ is controlled by mass-flow controller 256 from gas source 251, where the $TiI_4$ is maintained at about 105-110° C. The pressure in reaction chamber is at about 10 mbar. In one embodiment, the substrate temperature is maintained between about 250° C. and about 490° C. In another embodiment, the substrate temperature is maintained between about 250° C. and about 300° C. The $TiI_4$ reacts with the surface of the substrate 210 in the desired region defined by the unmasked areas of the substrate 210. In other embodiments, a titanium containing precursor is selected from a group consisting of $TiCl_4$, $Ti(OC_2H_5)_4$, and $Ti(OC_3H_7)_4$.

At block 415, a first purging gas is pulsed into the reaction chamber 220. In particular, nitrogen is used as a purging gas and a carrier gas. The nitrogen flow is controlled by mass-flow controller 266 from the purging gas source 261 into the gas conduit 270. Using the pure nitrogen purge avoids overlap of the precursor pulses and possible gas phase reactions. Following the purge, an oxygen containing precursor is pulsed into the reaction chamber 220, at block 420.

For the titanium sequence using a $TiI_4$ or $TiCl_4$ as the precursor, $H_2O_2$ vapor is selected as the precursor acting as a reactant to form a Ti and O on the substrate 210. Alternately, water vapor can be used as the oxygen containing precursor. The $H_2O_2$ vapor is pulsed into the reaction chamber 220 through gas conduit 270 from gas source 252 by mass-flow controller 257. The $H_2O_2$ vapor aggressively reacts at the surface of substrate 210.

Following the pulsing of an oxygen containing precursor, a second purging gas is injected into the reaction chamber 220, at block 425. Nitrogen gas is used to purge the reaction chamber after pulsing each precursor gas in the titanium/oxygen sequence. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

During a $TiI_4$/water vapor sequence, the substrate is held between about 250° C. and about 490° C. by the heating element 230. In other embodiments the substrate is held between about 250° C. and 300° C. The $TiI_4$ pulse time ranges from about 0.2 sec to about 0.5 sec. After the $TiI_4$ pulse, the titanium sequence continues with a purge pulse followed by a $H_2O_2$ vapor pulse followed by a purge pulse. In one embodiment, the $H_2O_2$ vapor pulse time ranges from about 0.5 sec to about 2.0 sec, and the first and second purging pulse times are each about 0.5 sec.

At block 430, the pulsing of the titanium containing precursor, the pulsing of the oxygen containing precursor, and the pulsing of the first and second purging gas are repeated for a number of cycles. After repeating the titanium/oxygen sequence for a selected number of cycles, a lanthanide containing precursor is pulsed into the reaction chamber, at block 435. In one embodiment, the lanthanide is selected from a group consisting of Nd, Tb, and Dy.

At block 440, a third purging gas is introduced into the system. Nitrogen gas can also be used as a purging and carrier gas. The nitrogen flow is controlled by mass-flow controller 267 from the purging gas source 262 into the gas conduit 270 and subsequently into the reaction chamber 220. In another embodiment, argon gas is used as the purging gas. Following the pulsing of the third purging gas, a reactant precursor is pulsed into the reaction chamber 220, at block 445. The reactant precursor is selected to produce an atomic layer deposition reaction with the lanthanide containing precursor. The selection of the reactant precursor is based on the selected lanthanide dopant for a particular application.

Following the pulsing of the reactant precursor, a fourth purging gas is injected into the reaction chamber 220, at block 450. Nitrogen gas is used to purge the reaction chamber after pulsing each precursor gas. In another embodiment, argon gas is used as the purging gas. Excess precursor gas, and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

At block 455, a determination is made as to whether the number of substituted dopant cycles has equaled a predetermined number. The predetermined number of substitution cycles is selected to set the percentage of lanthanide dopant in the $TiO_x$ film. In one embodiment, the percentage is set ranging from about 5% to about 40% lanthanide in the lanthanide doped $TiO_x$ film. If the number of completed substitution cycles is less than the predetermined number, the lanthanide containing precursor is pulsed into the reaction chamber, at block 435, and the process continues. If the number of completed substitution cycles equals the predetermined number, then a determination is made as to whether a total number of combined cycles has been completed to form a desired thickness, at block 460. If the total number of cycles to form the desired thickness has not been completed, a number of cycles for the titanium/oxygen sequence is repeated, at block 430, and the process continues. If the total number of cycles to form the desired thickness has been completed, the dielectric film containing lanthanide doped $TiO_x$ can be annealed. The lanthanide doped $TiO_x$ formed is amorphous and remains amorphous after annealing.

The thickness of a lanthanide doped $TiO_x$ film is determined by a fixed growth rate for the pulsing periods and precursors used, set at a value such as N nm/combined cycle, dependent upon the lanthanide dopant used and the number of cycles of the lanthanide dopant sequence relative to the titanium sequence that form a combined sequence. For a desired lanthanide doped $TiO_x$ film thickness, t, in an application such as forming a gate dielectric of a MOS transistor, the ALD process is repeated for t/N total combined cycles. Once the t/N cycles have completed, no further ALD processing for lanthanide doped $TiO_x$ is required.

At block 470, after forming the lanthanide doped $TiO_x$, processing the device having the dielectric layer containing lanthanide doped $TiO_x$ is completed. In one embodiment, completing the device includes completing the formation of a transistor. In another embodiment, completing the device includes completing the formation of a capacitor. Alternately, completing the process includes completing the construction of a memory device having a array with access transistors formed with gate dielectrics containing atomic layer deposited lanthanide doped $TiO_x$. Further, in another embodiment, completing the process includes the formation of an electronic system including an information handling device that uses electronic devices with transistors formed with dielectric films containing atomic layer deposited lanthanide doped $TiO_x$. Typically, information handling devices such as computers include many memory devices, having many access transistors.

It can appreciated by those skilled in the art that the elements of a method for forming an atomic layer deposited lanthanide doped $TiO_x$ film in the embodiment of FIG. 4A can be performed with various number of cycles for the titanium sequence and various number of cycles for the lanthanide dopant sequence. In one embodiment, substituting a lanthanide dopant cycle for one or more cycles includes substituting a number of lanthanide dopant cycles to form a dielectric layer containing $TiO_x$ doped with a predetermined percentage of the lanthanide in the range from about 5% to about 40% lanthanide. In another embodiment, ALD processing of a lanthanide doped $TiO_x$ dielectric film includes controlling the repeating for a number of cycles the pulsing of the titanium containing precursor and the pulsing of the oxygen containing precursor and controlling the substituting of the lanthanide dopant cycle for one or more cycles to grow an amorphous dielectric film containing lanthanide doped $TiO_x$, where the dielectric film has a dielectric constant ranging from about 47 to about 110.

Figure 4B:
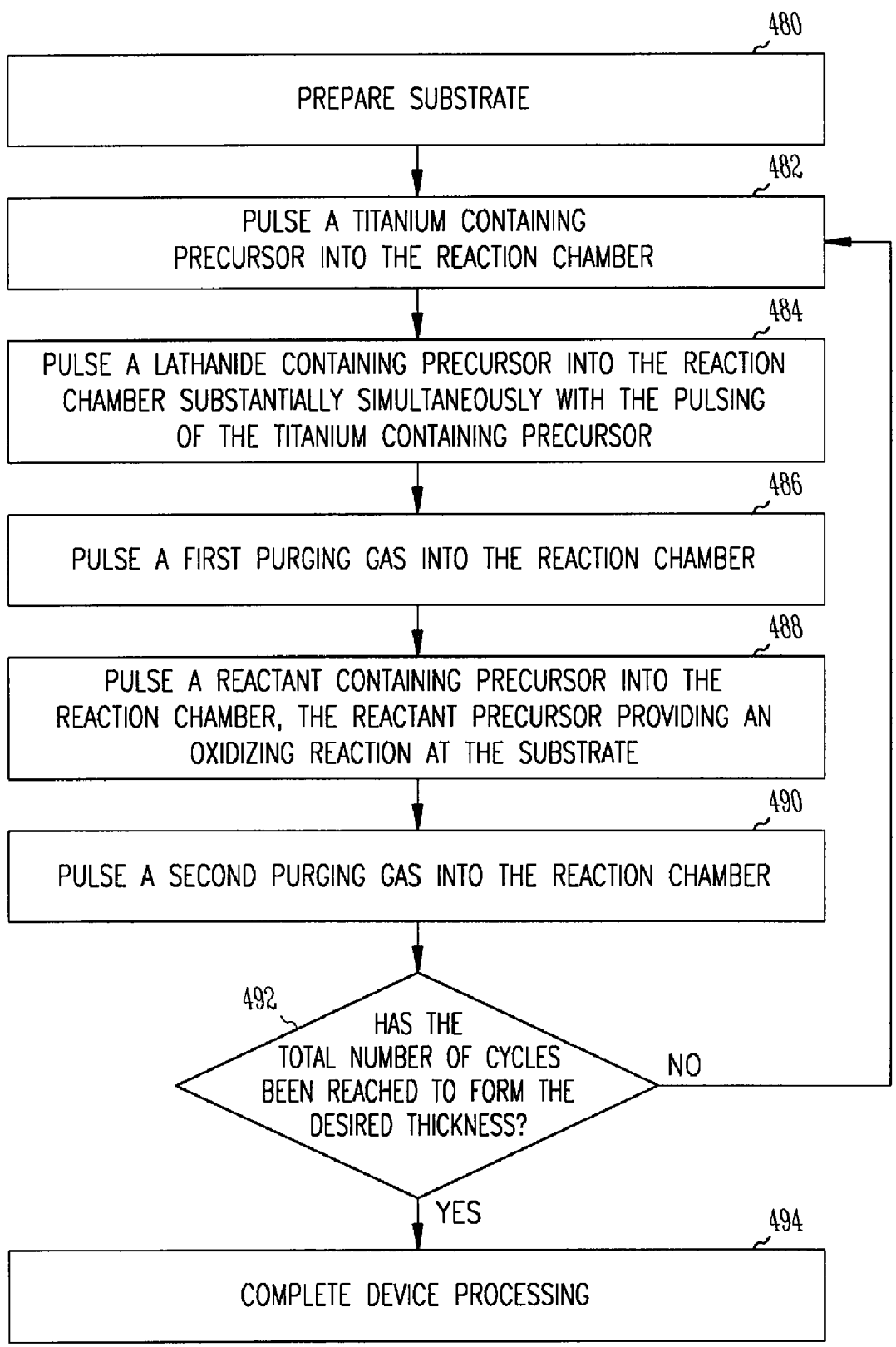
FIG. 4B illustrates a flow diagram of elements for another embodiment of a method for doping TiO$_x$ with a lanthanide to form a dielectric film by atomic layer deposition, according to the teachings of the present invention.

FIG. 4B illustrates a flow diagram of elements for another embodiment of a method for doping $TiO_x$ with a lanthanide to form a dielectric film by atomic layer deposition, according to the teachings of the present invention. This embodiment can be implemented with the atomic layer deposition system 200 of FIGS. 2A,B.

At block 480, a substrate 210 is prepared in a similar manner has at block 405 in FIG. 4A. Then, a titanium containing precursor is pulsed into reaction chamber 220, at block 482. A lanthanide containing precursor is pulsed into reaction chamber 220 substantially simultaneously with the pulsing of the titanium containing precursor, at block 484. The mixture of the lanthanide containing precursor and the titanium containing precursor is regulated such that the lanthanide acts as a dopant in a dielectric film containing the titanium. After pulsing the titanium containing precursor and the lanthanide containing precursor, a first purging gas is pulsed into reaction chamber 220, at block 486. Excess precursor gases and reaction by-products are removed from the system by the purge gas in conjunction with the exhausting of the reaction chamber 220 using vacuum pump 282 through mass-flow controller 287, and exhausting of the gas conduit 270 by the vacuum pump 281 through mass-flow controller 286.

A reactant containing precursor is pulsed into reaction chamber 220, at block 488. The reactant containing precursor provides an oxidizing reaction at substrate 210. A second purging gas is pulsed into reaction chamber 220, at block 490. Completing the pulsing of the second purging gas into reaction chamber 220 completes one cycle for a titanium-lanthanide dopant sequence. Then, it is determined whether the total number of cycles for the titanium-lanthanide dopant sequence has been reached to form the desired thickness for a dielectric film containing lanthanide doped $TiO_x$, at block 492.

If the total number of cycles to form the desired thickness has not been completed, the titanium containing precursor is pulsed into reaction chamber, at block 482, and the process continues. If the total number of cycles to form the desired thickness has been completed, the dielectric film containing lanthanide doped $TiO_x$ can be annealed. The lanthanide doped $TiO_x$ formed is amorphous and remains amorphous after annealing.

The thickness of a lanthanide doped $TiO_x$ film is determined by a fixed growth rate for the pulsing periods and precursors used, set at a value such as N nm/cycle, dependent upon the titanium precursor/lanthanide dopant precursor mixture used. For a desired lanthanide doped $TiO_x$ film thickness, t, in an application such as forming a gate dielectric of a MOS transistor, the ALD process is repeated for t/N total cycles. Once the t/N cycles have completed, no further ALD processing for lanthanide doped $TiO_x$ is required. After forming the lanthanide doped $TiO_x$, processing the device having the dielectric layer containing lanthanide doped $TiO_x$ is completed, at block 494, in a similar manner as for block 470 of FIG. 4A.

It can appreciated by those skilled in the art that the elements of a method for forming an atomic layer deposited lanthanide doped $TiO_x$ film in the embodiment of FIG. 4B can be performed with various percentages for the lanthanide containing precursor in the precursor mixture. In one embodiment, pulsing a lanthanide containing precursor into the reaction chamber includes regulating the percentage of the lanthanide containing precursor relative to the titanium containing precursor to form a dielectric layer containing $TiO_x$ doped with a predetermined percentage of the lanthanide. In another embodiment, pulsing a lanthanide containing precursor into the reaction chamber includes regulating the percentage of the lanthanide containing precursor relative to the titanium containing precursor to form a dielectric layer containing $TiO_x$ doped with a predetermined percentage of the lanthanide in the range from about 5% to about 40% lanthanide. In another embodiment, pulsing a lanthanide containing precursor into the reaction chamber includes regulating the percentage of the lanthanide containing precursor relative to the titanium containing precursor to form a dielectric film containing an amorphous lanthanide doped $TiO_x$ film, where the dielectric film has a dielectric constant ranging from about 47 to about 110. In another embodiment, pulsing a lanthanide containing precursor includes a lanthanide selected from a group consisting of Nd, Tb, and Dy.

Atomic layer deposition of a lanthanide doped $TiO_x$ dielectric layer can be processed in a atomic layer deposition system such as ALD system 200 under computer control to perform various embodiments, in accordance with the teachings of the current invention, and operated under computer-executable instructions to perform these embodiments. In an embodiment, a computerized method and the computer-executable instructions for a method for forming a dielectric film can include depositing titanium and oxygen onto a substrate surface by atomic layer deposition, and depositing a lanthanide dopant by atomic layer deposition onto the substrate surface containing the deposited titanium and oxygen. In another embodiment, a computerized method and the computer-executable instructions for a method for forming a dielectric film can include pulsing a titanium containing precursor into a reaction chamber containing a substrate, pulsing an oxygen containing precursor into the reaction chamber, repeating for a number of cycles the pulsing of the titanium containing precursor and the pulsing of the oxygen containing precursor, and substituting a dopant cycle for one or more cycles of the pulsing of the titanium containing precursor and the pulsing of the oxygen containing precursor. The dopant cycle can include pulsing a lanthanide containing precursor into the reaction chamber, and pulsing a reactant precursor into the reaction chamber, where the reactant precursor is selected to produce an oxidizing reaction for the lanthanide at the substrate.

In another embodiment, a computerized method and the computer-executable instructions for a method for forming a dielectric film can include pulsing a titanium containing precursor into a reaction chamber containing a substrate, pulsing a lanthanide containing precursor into the reaction chamber substantially simultaneously with the pulsing of the titanium containing precursor, and pulsing a reactant precursor into the reaction chamber. The reactant precursor provides an oxidizing reaction at the substrate.

In another embodiment, a computerized method and the computer-executable instructions for a method for forming a dielectric film can further include controlling an environment of a reaction chamber. Additionally, the computerized method controls the pulsing of purging gases, one for each precursor gas and pulsing each purging gas after pulsing the associated precursor gas. Using a computer to control parameters for growing the dielectric film provides for processing the dielectric film over a wide range of parameters allowing for the determination of an optimum parameter set for the ALD system used. The computer-executable instructions can be provided in any computer-readable medium. Such computer-readable medium includes, but is not limited to, floppy disks, diskettes, hard disks, CD-ROMS, flash ROMS, non-volatile ROM, and RAM.

An embodiment of this method can be realized using ALD system 200 of FIG. 2A, where the controls for the individual elements of ALD system 200 are coupled to a computer, not shown in FIG. 2A. The computer provides control of the operation for processing a lanthanide doped $TiO_x$ dielectric layer by regulating the flow of precursor gases into reaction chamber 220. The computer can control the flow rate of precursor gases and the pulsing periods for these gases by controlling mass-flow controllers 256-259. Additionally, the computer can control the temperature of gas sources 251-254. Further, the pulse period and flow of purging gases from purging gas sources 261, 262 can be regulated through computer control of mass-flow controllers 266, 267, respectively.

The computer can also regulate the environment of reactor chamber 220 in which a dielectric film is being formed on substrate 210. The computer regulates the pressure in reaction chamber 220 within a predetermined pressure range by controlling vacuum pumps 281, 282 through mass-flow controllers 286, 287, respectively. The computer also regulates the temperature range for substrate 210 within a predetermined range by controlling heater 230.

For convenience, the individual control lines to elements of ALD 200, as well as a computer, are not shown in FIG. 2A. The above description of the computer control in conjunction with FIG. 2A provides information for those skilled in the art to practice embodiments for forming a dielectric layer containing lanthanide doped $TiO_x$ using a computerized method as described herein.

The embodiments described herein provide a process for growing a dielectric film having a wide range of useful equivalent oxide thickness, $t_{eq}$, associated with a dielectric constant in the range from about 47 to about 110. The $t_{eq}$ range in accordance with embodiments of the present invention are shown in the following

| κ | Physical Thickness t = 1.0 nm (1.0 × 10¹ Å) $t_{eq}$ (Å) | Physical Thickness t = 5.0 nm (5.0 × 10¹ Å) $t_{eq}$ (Å) | Physical Thickness t = 100.0 nm (1 × 10³ Å) $t_{eq}$ (Å) | Physical Thickness t = 350 nm (3.5 × 10³ Å) $t_{eq}$ (Å) |
|---|---|---|---|---|
| 50 | 0.78 | 3.90 | 78.00 | 273.00 |
| 75 | 0.52 | 2.60 | 52.00 | 182.00 |
| 100 | 0.39 | 1.95 | 39.00 | 136.50 |
| 110 | 0.35 | 1.77 | 35.45 | 124.09 |

The relatively large dielectric constant for material layers of lanthanide doped $TiO_x$ allows for the engineering of dielectric films having a physical thickness in the 100 nm (1000 Å) range, while achieving a $t_{eq}$ of less than 100 Å. Further, growing thin layers, or films, of lanthanide doped $TiO_x$ provides for $t_{eq}$ in the monolayer range. From above, it is apparent that a film containing lanthanide doped $TiO_x$ can be attained with a $t_{eq}$ ranging from 1.5 Å to 5 Å. Further, such a film can provide a $t_{eq}$ significantly less than 2 or 3 Å, even less than 1.5 Å.

Further, dielectric films of lanthanide doped $TiO_x$ formed by atomic layer deposition can provide not only ultra thin $t_{eq}$ films, but also films with relatively low leakage current. In addition to using ALD to provide precisely engineered film thicknesses, attainment of relatively low leakage current is engineered by doping with lanthanides selected from a group consisting of Nd, Tb, and Dy. Though a layer of undoped $TiO_x$ can be amorphous, which assists the reduction of leakage current, doping with these lanthanides yields a doped amorphous $TiO_x$ with enhanced leakage current characteristics. Leakage currents on the order of $10^{-7}$ A/cm² or smaller in $TiO_x$ layers doped with Nd, Tb, or Dy can be attained, which are orders of magnitude smaller than for undoped $TiO_x$. Further, the breakdown electric fields are several factors larger for layers of $TiO_x$ doped with Nd, Tb, or Dy than for layers of undoped $TiO_x$.

The doping of the $TiO_x$ layer with a lanthanide occurs as a substitution of a lanthanide atom for a Ti atom. The resultant doped $TiO_x$ layer is a layer of amorphous $Ti_{1-y}L_yO_x$, where L is a lanthanide. Controlling the ALD cycles of the titanium sequence and the lanthanide dopant sequence allows a $Ti_{1-y}L_yO_x$, or lanthanide doped $TiO_x$, dielectric layer to be formed where the lanthanide, L, can range from about 5% to about 40% of the dielectric layer formed. Such $TiO_x$ layers doped with Nd, Tb, or Dy formed by ALD can provide the reduced leakage current and increased breakdown electric fields mentioned above.

The novel processes described above for performing atomic layer deposition of lanthanide doped $TiO_x$ can precisely control the thickness of the dielectric layer formed. In addition to providing an ultra thin $t_{eq}$, atomic layer deposition provides for substantially smooth surfaces and limited interfacial layer formation. Additionally, the novel process can be implemented to form transistors, capacitors, memory devices, and other electronic systems including information handling devices. With careful preparation and engineering of the lanthanide doped $TiO_x$ layer, limiting the size of interfacial regions, a $t_{eq}$ of about 3 Å or lower is anticipated.

A transistor 100 as depicted in FIG. 1 can be formed by forming a source region 120 and a drain region 130 in a silicon based substrate 110 where source and drain regions 120, 130 are separated by a body region 132. Body region 132 defines a channel having a channel length 134. A dielectric film is disposed on substrate 110 formed as a layer containing lanthanide doped $TiO_x$ on substrate 110 in a reaction chamber by atomic layer deposition. The resulting lanthanide doped $TiO_x$ dielectric layer forms gate dielectric 140.

A gate 150 is formed over gate dielectric 140. Typically, forming gate 150 includes forming a polysilicon layer, though a metal gate can be formed in an alternative process. Forming the substrate, the source and drain regions, and the gate is performed using standard processes known to those skilled in the art. Additionally, the sequencing of the various elements of the process for forming a transistor is conducted with standard fabrication processes, also as known to those skilled in the art.

Figure 5:
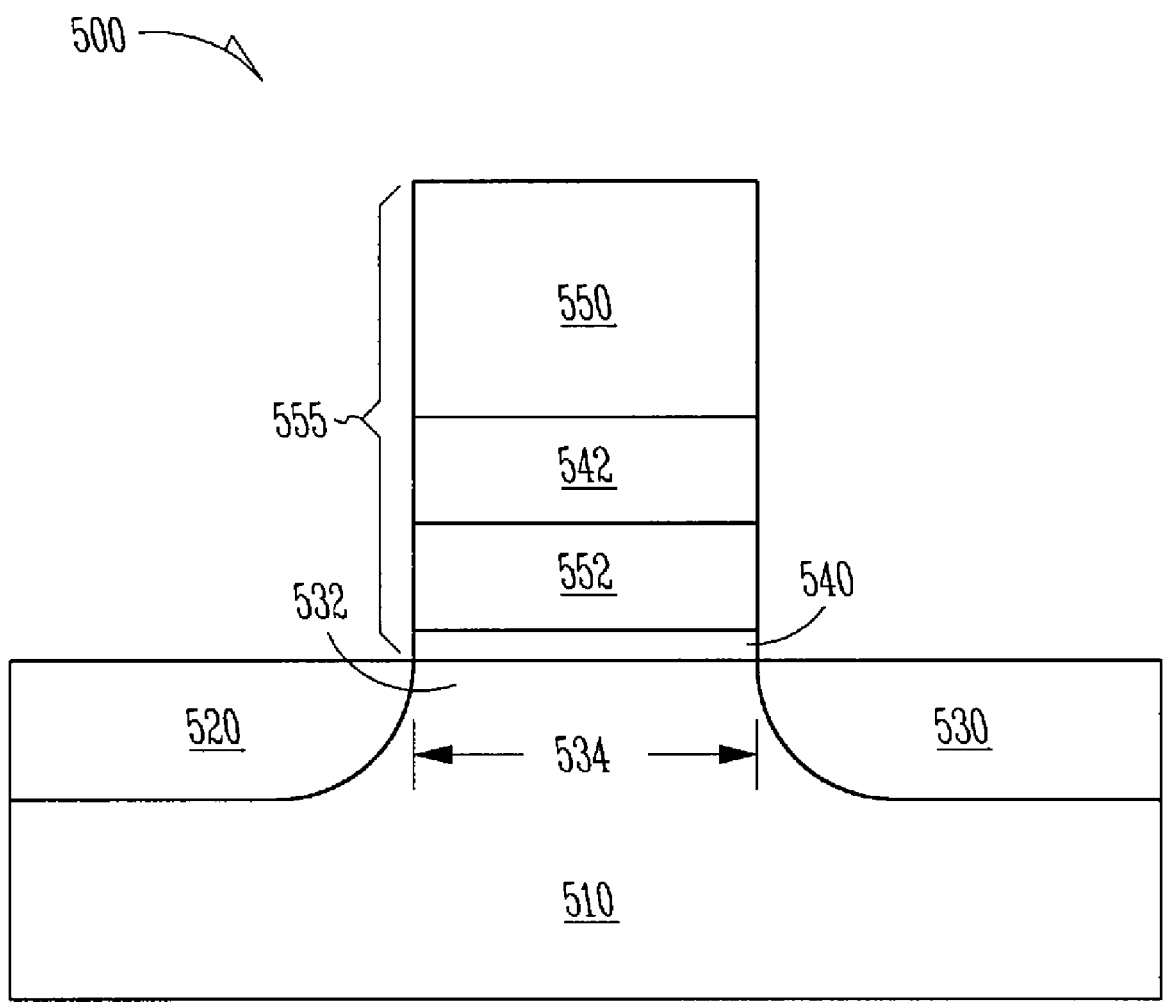
FIG. 5 shows an embodiment of a configuration of a transistor having an atomic layer deposited lanthanide doped TiO$_x$ dielectric film, according to the teachings of the present invention.

The method for forming an atomic layer deposited lanthanide doped $TiO_x$ in various embodiments can be applied to other transistor structures having dielectric layers. FIG. 5 shows an embodiment of a configuration of a transistor 500 having an atomic layer deposited lanthanide doped $TiO_x$ dielectric film. Transistor 500 includes a silicon based substrate 510 with a source 520 and a drain 530 separated by a body region 532. Body region 532 between source 520 and drain 530 defines a channel region having a channel length 534. Located above body region 532 is a stack 555 including a gate dielectric 540, a floating gate 552, a floating gate dielectric 542, and a control gate 550. Gate dielectric 540 can be formed as described above with the remaining elements of the transistor 500 formed using processes known to those skilled in the art. Alternately, both gate dielectric 540 and floating gate dielectric 542 can be formed as dielectric layers containing lanthanide doped $TiO_x$ in various embodiments as described herein.

The embodiments of methods for forming lanthanide doped $TiO_x$ dielectric films can also be applied to forming capacitors in various integrated circuits, memory devices, and electronic systems. In one embodiment for forming a capacitor, a method can include forming a first conductive layer, forming a dielectric film containing lanthanide doped $TiO_x$ on the first conductive layer by depositing titanium and oxygen onto the first conductive layer by atomic layer deposition and depositing a lanthanide dopant by atomic layer deposition onto the first conductive layer containing the deposited titanium and oxygen, and forming a second conductive layer on the dielectric film. ALD formation of the lanthanide doped TiO film allows the lanthanide to be selectively doped into the $TiO_x$ film within a predetermined range for the percentage of the lanthanide in the film. Alternately, a capacitor can be constructed by forming a conductive layer on a substrate, forming a dielectric film containing lanthanide doped $TiO_x$ using any of the embodiments described herein, and forming another conductive layer on the dielectric film.

Figure 6:
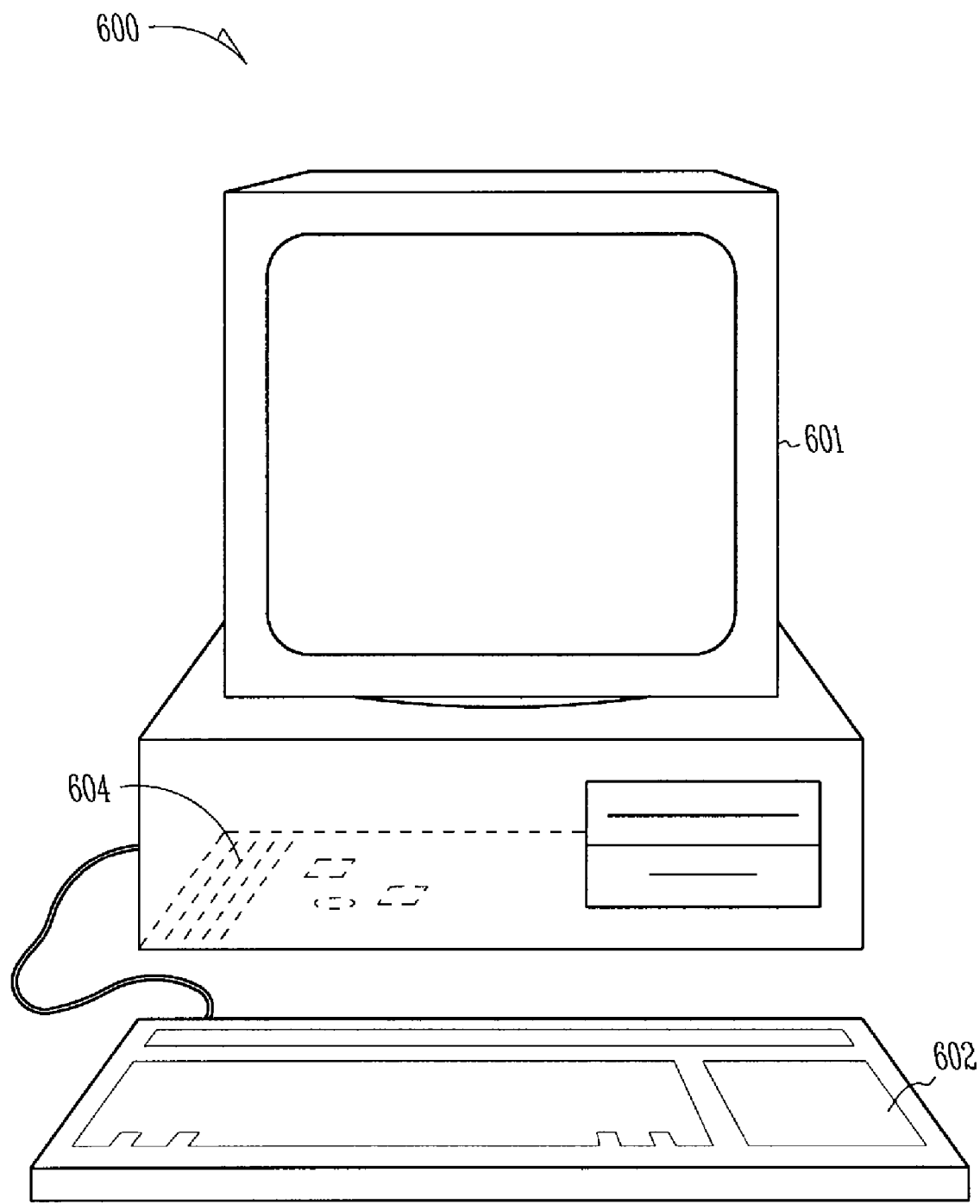
FIG. 6 shows an embodiment of a personal computer incorporating devices having an atomic layer deposited lanthanide doped TiO$_x$ dielectric film, according to the teachings of the present invention.
Figure 7:
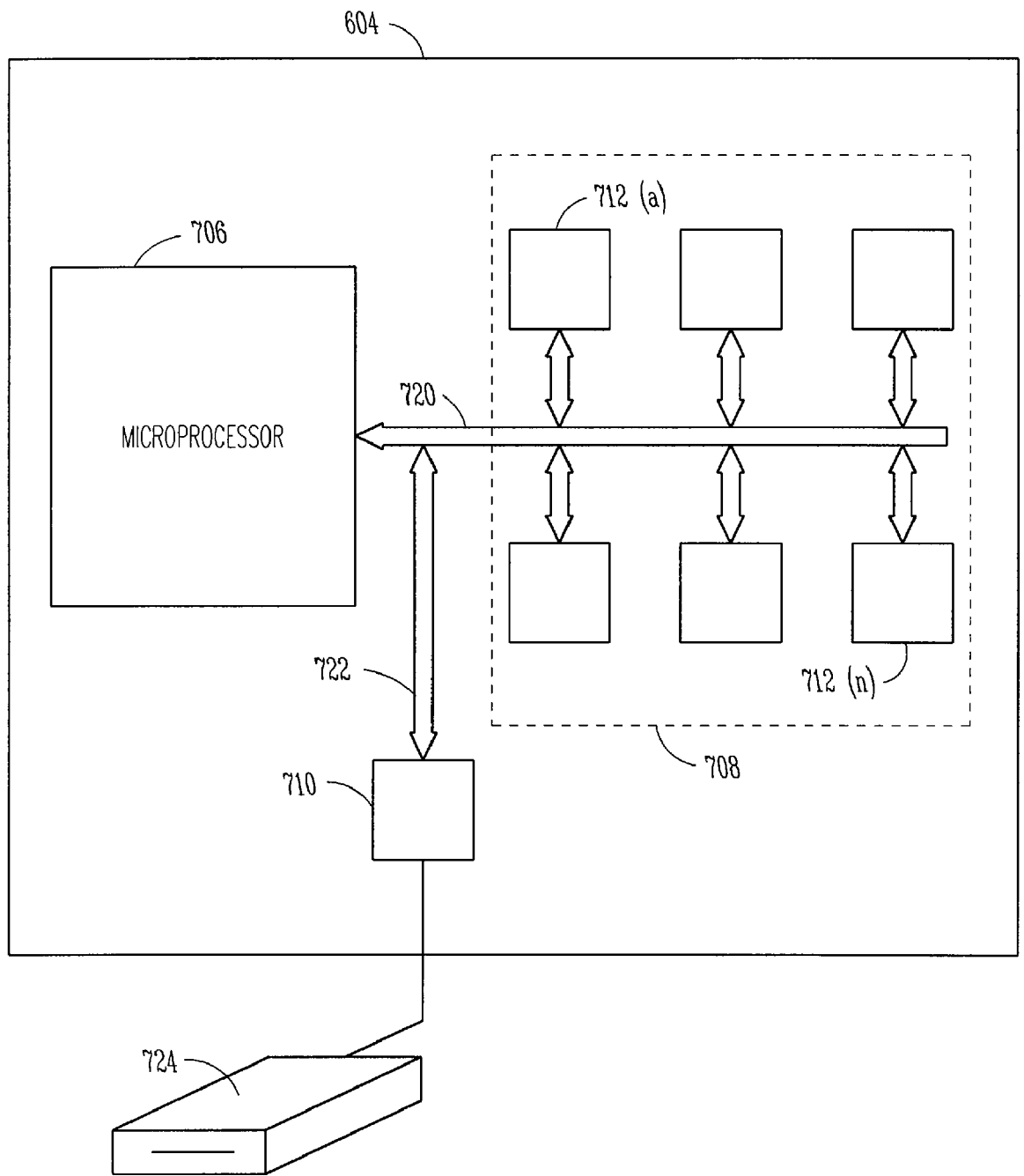
FIG. 7 illustrates a schematic view of an embodiment of a central processing unit incorporating devices having an atomic layer deposited lanthanide doped TiO$_x$ dielectric film, according to the teachings of the present invention.
Figure 8:
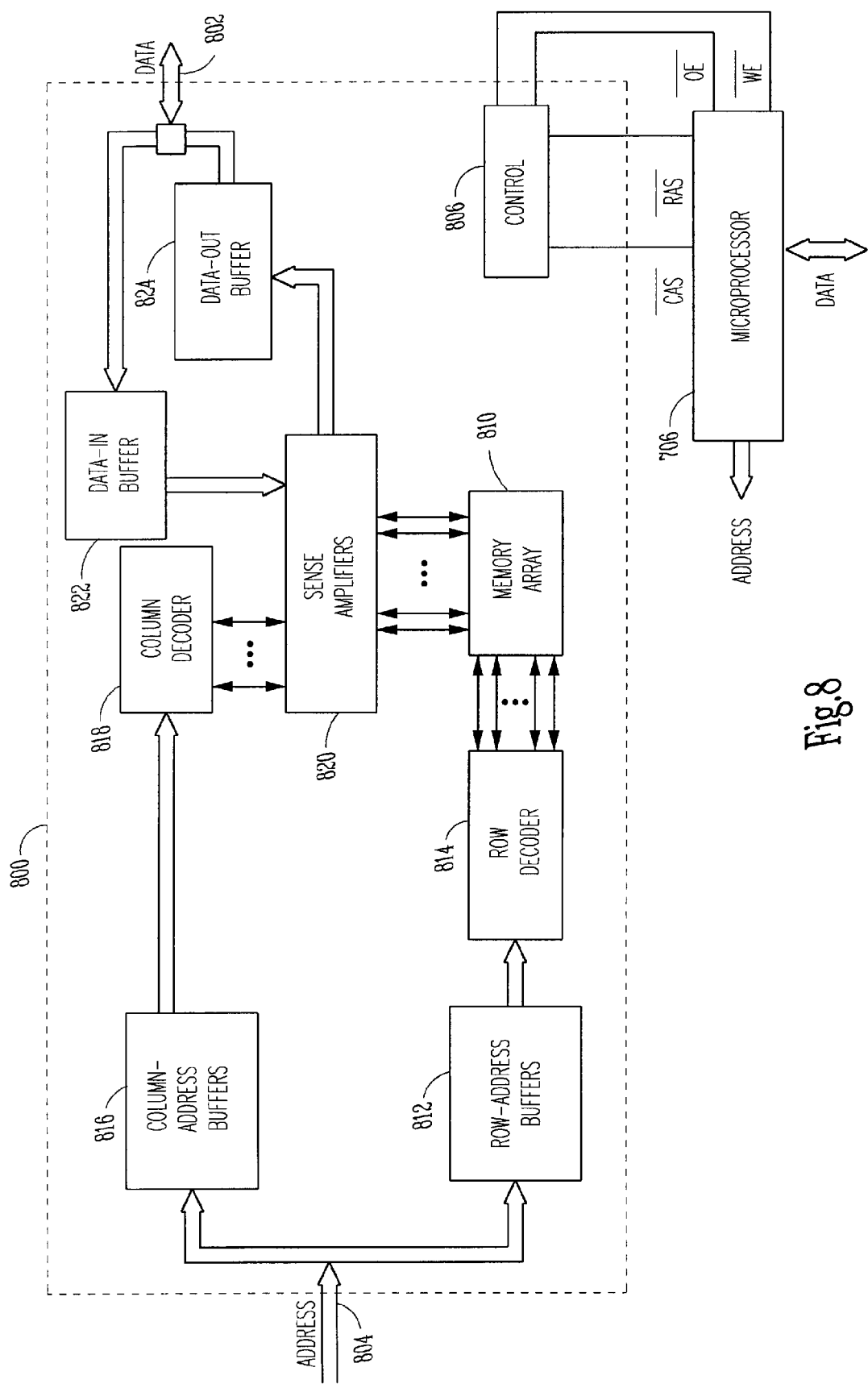
FIG. 8 illustrates a schematic view of an embodiment of a DRAM memory device having an atomic layer deposited lanthanide doped TiO$_x$ dielectric film, according to the teachings of the present invention.

Transistors, capacitors, and other devices having dielectric films containing atomic layer deposited lanthanide doped $TiO_x$ formed by the methods described above may be implemented into memory devices and electronic systems including information handling devices. Such information devices can include wireless systems, telecommunication systems, and computers. An embodiment of a computer having a dielectric layer containing atomic layer deposited lanthanide doped $TiO_x$ is shown in FIGS. 6-8 and described below. While specific types of memory devices and computing devices are shown below, it will be recognized by one skilled in the art that several types of memory devices and electronic systems including information handling devices utilize the invention.

A personal computer, as shown in FIGS. 6 and 7, can include a monitor 600, keyboard input 602 and a central processing unit 604. Central processor unit 604 typically includes microprocessor 706, memory bus circuit 708 having a plurality of memory slots 712(a-n), and other peripheral circuitry 710. Peripheral circuitry 710 permits various peripheral devices 724 to interface processor-memory bus 720 over input/output (I/O) bus 722. The personal computer shown in FIGS. 6 and 7 also includes at least one transistor having a dielectric layer containing atomic layer deposited lanthanide doped $TiO_x$ according an embodiment of the present invention.

Microprocessor 706 produces control and address signals to control the exchange of data between memory bus circuit 708 and microprocessor 706 and between memory bus circuit 708 and peripheral circuitry 710. This exchange of data is accomplished over high speed memory bus 720 and over high speed I/O bus 722.

Coupled to memory bus 720 are a plurality of memory slots 712(a-n) which receive memory devices well known to those skilled in the art. For example, single in-line memory modules (SIMMs) and dual in-line memory modules (DIMMs) may be used in the implementation of embodiment of the present invention.

These memory devices can be produced in a variety of designs which provide different methods of reading from and writing to the dynamic memory cells of memory slots 712. One such method is the page mode operation. Page mode operations in a DRAM are defined by the method of accessing a row of a memory cell arrays and randomly accessing different columns of the array. Data stored at the row and column intersection can be read and output while that column is accessed. Page mode DRAMs require access steps which limit the communication speed of memory circuit 708.

An alternate type of device is the extended data output (EDO) memory which allows data stored at a memory array address to be available as output after the addressed column has been closed. This memory can increase some communication speeds by allowing shorter access signals without reducing the time in which memory output data is available on memory bus 720. Other alternative types of devices include SDRAM, DDR SDRAM, SLDRAM and Direct RDRAM as well as others such as SRAM or Flash memories.

FIG. 8 illustrates a schematic view of an embodiment of a DRAM memory device 800 having an atomic layer deposited lanthanide doped $TiO_x$ dielectric film. Illustrative DRAM memory device 800 is compatible with memory slots 712(a-n). The description of DRAM memory device 800 has been simplified for purposes of illustrating a DRAM memory device and is not intended to be a complete description of all the features of a DRAM. Those skilled in the art will recognize that a wide variety of memory devices may be used in the implementation of embodiments of the present invention. The embodiment of a DRAM memory device shown in FIG. 8 includes at least one transistor having a gate dielectric containing atomic layer deposited lanthanide doped $TiO_x$ according to the teachings of the present invention.

Control, address and data information provided over memory bus 720 is further represented by individual inputs to DRAM 800, as shown in FIG. 8. These individual representations are illustrated by data lines 802, address lines 804 and various discrete lines directed to control logic 806.

As is well known in the art, DRAM 800 includes memory array 810 which in turn comprises rows and columns of addressable memory cells. Each memory cell in a row is coupled to a common word line. The word line is coupled to gates of individual transistors, where at least one transistor has a gate coupled to a gate dielectric containing atomic layer deposited lanthanide doped $TiO_x$ in accordance with the method and structure previously described above. Additionally, each memory cell in a column is coupled to a common bit line. Each cell in memory array 810 includes a storage capacitor and an access transistor as is conventional in the art.

DRAM 800 interfaces with, for example, microprocessor 706 through address lines 804 and data lines 802. Alternatively, DRAM 800 may interface with a DRAM controller, a micro-controller, a chip set or other electronic system. Microprocessor 706 also provides a number of control signals to DRAM 800, including but not limited to, row and column address strobe signals RAS and CAS, write enable signal WE, an output enable signal OE and other conventional control signals.

Row address buffer 812 and row decoder 814 receive and decode row addresses from row address signals provided on address lines 804 by microprocessor 706. Each unique row address corresponds to a row of cells in memory array 810. Row decoder 814 includes a word line driver, an address decoder tree, and circuitry which translates a given row address received from row address buffers 812 and selectively activates the appropriate word line of memory array 810 via the word line drivers.

Column address buffer 816 and column decoder 818 receive and decode column address signals provided on address lines 804. Column decoder 818 also determines when a column is defective and the address of a replacement column. Column decoder 818 is coupled to sense amplifiers 820. Sense amplifiers 820 are coupled to complementary pairs of bit lines of memory array 810.

Sense amplifiers 820 are coupled to data-in buffer 822 and data-out buffer 824. Data-in buffers 822 and data-out buffers 824 are coupled to data lines 802. During a write operation, data lines 802 provide data to data-in buffer 822. Sense amplifier 820 receives data from data-in buffer 822 and stores the data in memory array 810 as a charge on a capacitor of a cell at an address specified on address lines 804.

During a read operation, DRAM 800 transfers data to microprocessor 706 from memory array 810. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 820 detects and amplifies a difference in voltage between the complementary bit lines. The sense amplifier passes the amplified voltage to data-out buffer 824.

Control logic 806 is used to control the many available functions of DRAM 800. In addition, various control circuits and signals not detailed herein initiate and synchronize DRAM 800 operation as known to those skilled in the art. As stated above, the description of DRAM 800 has been simplified for purposes of illustrating an embodiment of the present invention and is not intended to be a complete description of all the features of a DRAM. Those skilled in the art will recognize that a wide variety of memory devices, including but not limited to, SDRAMs, SLDRAMs, RDRAMs and other DRAMs and SRAMs, VRAMs and EEPROMs, may be used in the implementation of embodiments of the present invention. The DRAM implementation described herein is illustrative only and not intended to be exclusive or limiting.

CONCLUSION

A dielectric film containing atomic layer deposited lanthanide doped $TiO_x$ and a method of fabricating such a dielectric film produce a reliable dielectric film having an equivalent oxide thickness thinner than attainable using $SiO_2$. Dielectric films containing atomic layer deposited lanthanide doped $TiO_x$ formed using the methods described herein are thermodynamically stable such that the dielectric films formed will have minimal reactions with a silicon substrate or other structures during processing.

Lanthanide doped $TiO_x$ films formed by atomic layer deposition can be amorphous and possess smooth surfaces. Such lanthanide doped $TiO_x$ films can provide enhanced electrical properties due to their smoother surface resulting in reduced leakage current. Furthermore, doping with a lanthanide such as Nd, Tb, and Dy provide for increased breakdown electric fields and decreased leakage currents than can be attained with an undoped $TiO_x$ film. Additionally, formation of the lanthanide doped $TiO_x$ films by atomic layer deposition allows for the engineering of the relative concentrations of the lanthanide dopant and the limited occurrence of an unwanted $SiO_2$ interfacial layer. These properties of layers containing atomic layer deposited lanthanide doped $TiO_x$ films allow for application as dielectric layers in numerous electronic devices and systems.

Capacitors, transistors, higher level ICs or devices, and electronic systems are constructed utilizing the novel process for forming a dielectric film having an ultra thin equivalent oxide thickness, $t_{eq}$. Gate dielectric layers or films containing atomic layer deposited lanthanide doped $TiO_x$ are formed having a dielectric constant ($\kappa$) substantially higher than that of silicon oxide, where the dielectric films are capable of a $t_{eq}$ thinner than 10 Å, thinner than the expected limit for $SiO_2$ gate dielectrics. At the same time, the physical thickness of the atomic layer deposited lanthanide doped $TiO_x$ dielectric film is much larger than the $SiO_2$ thickness associated with the $t_{eq}$ limit of $SiO_2$. Forming the relatively larger thickness provides advantages in processing gate dielectrics and other dielectric layers. Further, a lanthanide doped $TiO_x$ film processed in relatively low temperatures allowed by atomic layer deposition can provide amorphous dielectric films having relatively low leakage current for use as dielectric layers in electronic devices and systems.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. An electronic device comprising:
   a substrate;
   a dielectric layer having a lanthanide doped $TiO_x$ film, the lanthanide doped $TiO_x$ film structured as one or more monolayers, the dielectric layer disposed on the substrate.

2. The electronic device of claim 1, wherein the dielectric layer contains lanthanide doped $TiO_x$ with a predetermined percentage of the lanthanide in the range from about 5% to about 40% lanthanide.

3. The electronic device of claim 1, wherein the lanthanide doped $TiO_x$, includes Nd.

4. The electronic device of claim 1, wherein the lanthanide doped $TiO_x$ includes Tb.

5. The electronic device of claim 1, wherein the lanthanide doped $TiO_x$ includes Dy.

6. The electronic device of claim 1, wherein the dielectric layer is configured substantially as the lanthanide doped $TiO_x$ film.

7. A capacitor, comprising:
   a first conductive layer on a substrate;
   a dielectric layer containing a lanthanide doped $TiO_x$ film, the lanthanide doped $TiO_x$ film structured as one or more monolayers, the dielectric layer disposed on the first conductive layer; and
   a second conductive layer disposed on the dielectric layer.

8. The capacitor of claim 7, wherein the dielectric layer is substantially amorphous.

9. The capacitor of claim 7, wherein the dielectric layer exhibits a dielectric constant in the range from above 47 to 110.

10. The capacitor of claim 7, wherein the dielectric layer has a dielectric constant less than 80.

11. The capacitor of claim 7, wherein the lanthanide doped $TiO_x$ includes Nd.

12. The capacitor of claim 7, wherein the dielectric layer contains lanthanide doped $TiO_x$ with a predetermined percentage of the lanthanide in the range from about 5% to about 40% lanthanide.

13. A transistor comprising:
    a body region between a source region and a drain region on a substrate;
    a dielectric film containing having a lanthanide doped $TiO_x$ layer, the lanthanide doped $TiO_x$ layer structured as one or more monolayers, the dielectric disposed above the body region between a source region and a drain region; and
    a gate coupled to the dielectric film.

14. The transistor of claim 13, wherein the dielectric film is substantially amorphous.

15. The transistor of claim 13, wherein the dielectric film has a dielectric constant in the range from above 47 to 80.

16. The transistor of claim 13, wherein the dielectric film has an equivalent oxide thickness ($t_{eq}$) less than about 10 Angstroms.

17. The transistor of claim 13, wherein the dielectric film has an equivalent oxide thickness ($t_{eq}$) of less than about 3 Angstroms.

18. The transistor of claim 13, wherein the lanthanide doped $TiO_x$ includes Tb.

19. The transistor of claim 13, wherein the dielectric layer is configured substantially as the lanthanide doped $TiO_x$ film.

20. The transistor of claim 13, wherein the substrate includes silicon.

21. The transistor of claim 13, wherein the gate is a floating gate.

22. A transistor comprising:
    a body region between a source region and a drain region on a substrate; and
    a stack disposed on the body region between a source region and a drain region, the stack including a first dielectric layer containing a first lanthanide doped $TiO_x$ layer, the first lanthanide doped $TiO_x$ layer structured as one or more monolayers, the first dielectric layer disposed between and contacting a floating gate and a control gate.

23. The transistor of claim 22, wherein the stack contains a second dielectric layer containing a second lanthanide doped $TiO_x$ layer, the second dielectric layer disposed between and contacting the body region and the floating gate.

24. The transistor of claim 23, wherein the second lanthanide doped $TiO_x$ layer is structured as one or more mono layers.

25. The transistor of claim 23, wherein the second lanthanide doped $TiO_x$ layer and the first lanthanide doped $TiO_x$ layer include common elements.

26. The transistor of claim 23, wherein the second dielectric layer has an equivalent oxide thickness ($t_{eq}$) less than about 10 Angstroms.

27. The transistor of claim 22, wherein the lanthanide doped $TiO_x$ includes Dy.

28. A memory comprising:
a memory array having a number of transistors, at least one transistor including a gate coupled to a dielectric film containing lanthanide doped $TiO_x$, the lanthanide doped $TiO_x$ layer structured as one or more monolayers, the dielectric film disposed above a body region between a source region and a drain region.

29. The memory of claim 28, wherein the dielectric layer is configured substantially as the lanthanide doped $TiO_x$ film.

30. The memory of claim 28, wherein the dielectric film is disposed between the gate configured as a control gate and a floating gate.

31. The memory of claim 28, wherein the dielectric film is disposed between and contacting the gate and the body region.

32. The memory of claim 28, wherein the dielectric film has an equivalent oxide thickness ($t_{eq}$) less than about 10 Angstroms.

33. The memory of claim 28, wherein the lanthanide doped $TiO_x$ includes Dy.

34. An electronic system comprising:
a processor;
a memory, the memory including a memory array having a number of transistors, at least one transistor having a gate coupled to a dielectric film containing lanthanide doped $TiO_x$, the lanthanide doped $TiO_x$ layer structured as one or more monolayers, the dielectric film disposed above a body region between a source region and a drain region; and
a system bus that couples the processor to the memory.

35. The electronic system of claim 34, wherein the dielectric film has a dielectric constant less than 80.

36. The electronic system of claim 34, wherein the dielectric film has an equivalent oxide thickness less than 10 Å.

37. The electronic system of claim 34, wherein the lanthanide doped $TiO_x$ includes Nd.

38. The electronic system of claim 34, wherein the transistor includes a floating gate contacting the dielectric layer.

39. The electronic system of claim 34, wherein the electronic system includes a wireless device.

40. The electronic system of claim 34, wherein the electronic system includes a computer.

* * * * *